US009053771B2

(12) United States Patent
Yokou

(10) Patent No.: US 9,053,771 B2
(45) Date of Patent: Jun. 9, 2015

(54) SEMICONDUCTOR SYSTEM

(71) Applicant: PS4 Luxco S.a.r.l., Luxembourg (LU)

(72) Inventor: Hideyuki Yokou, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 14/270,926

(22) Filed: May 6, 2014

(65) Prior Publication Data

US 2014/0241095 A1      Aug. 28, 2014

Related U.S. Application Data

(63) Continuation of application No. 13/964,796, filed on Aug. 12, 2013, now Pat. No. 8,760,902, which is a continuation of application No. 13/595,793, filed on Aug. 27, 2012, now Pat. No. 8,542,516, which is a continuation of application No. 12/964,304, filed on Dec. 9, 2010, now Pat. No. 8,274,847.

(30) Foreign Application Priority Data

Dec. 11, 2009   (JP) ................................. 2009-281173

(51) Int. Cl.
| G11C 7/00 | (2006.01) |
| G11C 5/14 | (2006.01) |
| G11C 5/06 | (2006.01) |
| G11C 7/10 | (2006.01) |
| H01L 25/00 | (2006.01) |
| H01L 25/065 | (2006.01) |
| H01L 25/18 | (2006.01) |
| H05K 1/18 | (2006.01) |
| G11C 11/4074 | (2006.01) |

(52) U.S. Cl.
CPC .. *G11C 5/14* (2013.01); *G11C 5/06* (2013.01); *G11C 7/10* (2013.01); *H01L 25/00* (2013.01); *H01L 25/0657* (2013.01); *H01L 25/18* (2013.01); *H01L 2225/06513* (2013.01); *H01L 2225/06517* (2013.01); *H01L 2225/06541* (2013.01); *H01L 2924/15311* (2013.01); *H05K 1/18* (2013.01); *H01L 2224/16145* (2013.01); *H01L 2224/16225* (2013.01); *G11C 11/4074* (2013.01)

(58) Field of Classification Search
CPC .... G11C 5/025; G11C 5/147; G11C 11/4074; G11C 16/30; G11C 5/14
USPC ........................... 365/226, 189.09, 63, 51, 52
See application file for complete search history.

(56) References Cited

U.S. PATENT DOCUMENTS 7,692,977 B2 * 4/2010 Kim et al. ................ 365/189.09

* cited by examiner

Primary Examiner — David Lam

(57) ABSTRACT

To provide a semiconductor system including a plurality of core chips and an interface chip that controls the core chips. Each of the core chips includes an internal voltage generating circuit. The interface chip includes an unused chip information holding circuit that stores therein unused chip information of the core chips. The core chips respectively receive the unused chip information from the unused chip information holding circuit. When the unused chip information indicates an unused state, the internal voltage generating circuits are inactivated, and when the unused chip information indicates a used state, the internal voltage generating circuits are activated. With this configuration, unnecessary power consumption by the unused chips is reduced.

24 Claims, 15 Drawing Sheets

SEMICONDUCTOR SYSTEM

REFERENCE TO RELATED APPLICATIONS

This application is a continuation of U.S. patent application Ser. No. 13/964,796, filed Aug. 12, 2013, Now U.S. Pat. No. 8,760,920, which is a continuation of U.S. patent application Ser. No. 13/595,793, filed Aug. 27, 2012, which is a continuation of U.S. patent application Ser. No. 12/964,304, filed Dec. 9, 2010, U.S. Pat. No. 8,274,847, which claims the priority of Japanese Patent Application No. 2009-281173, filed Dec. 11, 2009, the contents of which prior applications are incorporated herein in their entirety by reference.

BACKGROUND OF THE INVENTION

1. Field of the Invention

The present invention relates to a semiconductor system, and more particularly relates to a semiconductor system including a plurality of controlled chips and controlling chips that control the controlled chips.

2. Description of the Related Art

A memory capacity that is required in a semiconductor device such as a dynamic random access memory (DRAM) has increased every year. In recent years, a memory device that is called a multi-chip package where plural memory chips are laminated is suggested to satisfy the required memory capacity. However, since the memory chip used in the multi-chip package is a common memory chip capable of operating even though the memory chip is a single chip, a so-called front end unit that performs a function of an interface with an external device (for example, memory controller) is included in each memory chip. For this reason, an area for a memory core in each memory chip is restricted to an area obtained by subtracting the area for the front end unit from a total chip area, and it is difficult to greatly increase a memory capacity for each chip (for each memory chip).

In addition, a circuit that constitutes the front end unit is manufactured at the same time as a back end unit including a memory core, regardless of the circuit being a circuit of a logic system. Therefore there have been a further problem that it is difficult to speed up the front end unit.

As a method to resolve the above problem, a method that integrates the front end unit and the back end unit in individual chips and laminates these chips, thereby constituting one semiconductor device, is suggested (for example, Japanese Patent Application Laid-Open (JP-A) No. 2007-157266). According to this method, with respect to plural core chips each of which is integrated with the back end unit without the front end unit, it becomes possible to increase a memory capacity for each chip (for each core chip) because an occupied area assignable for the memory core increases. Meanwhile, with respect to an interface chip that is integrated with the front end unit and is common to the plural core chips, it becomes possible to form its circuit with a high-speed transistor because the interface chip can be manufactured using a process different from that of the memory core. In addition, since the plural core chips can be allocated to one interface chip, it becomes possible to provide a semiconductor device that has a large memory capacity and a high operation speed as a whole.

However, this kind of semiconductor device is recognized as only one memory chip, in view of a controller. For this reason, when the plural core chips are allocated to one interface chip, how to perform an individual access to each core chip becomes a problem. In the case of the general multi-chip package, each memory chip is individually selected using a dedicated chip selection terminal (/CS) in each memory chip. Meanwhile, in the semiconductor device described above, since the chip selection terminal is provided in only the interface chip, each core chip cannot be individually selected by a chip selection signal.

In order to resolve this problem, JP-A No. 2007-157266 described above, a chip identification number is allocated to each core chip, a chip selection address is commonly provided from the interface chip to each core chip, and individual selection of each core chip is realized.

In Japanese Patent Application Laid-open No. 2007-157266 discloses an arrangement in which core chips (DRAM chips) are stacked in five layers, an interface chip is stacked on the topmost layer of the core chips, and these chips are connected to each other via through silicon vias. To achieve such a chip-stacked semiconductor device, chips are individually manufactured, and are stacked and packaged after they are tested for defects.

Sometimes defective core chips are found during checking after assembling the chips. In this case, discarding the entire chip-stacked semiconductor device is not always necessary because the remaining core chips and the interface chip are operating normally. There is a need of a method for relieving normally functioning core chips by obtaining a so-called partial product in which the semiconductor device itself is not considered as defective even though a portion of the core chips is defective by operating only the normally functioning core chips without using the defective core chips. Although not related to the chip-stacked semiconductor device, techniques of using the so-called partial product are disclosed in Japanese Patent Application Laid-open Nos. H9-128995 and H9-161997.

However, in the methods disclosed in Japanese Patent Application Laid-open Nos. H9-128995 and H9-161497, an output of an internal voltage generating circuit is also supplied to an unused area. Therefore, unnecessarily power is consumed by the internal voltage generating circuit itself, and there is also a problem that a leakage current is produced in the unused area. These problems are not limited to chip-stacked semiconductor devices, but also occur in a general semiconductor system including a plurality of controlled chips and controlling chips that control the controlled chips.

SUMMARY

In one embodiment, there is provided a semiconductor system that includes: a plurality of controlled chips each of which including an internal voltage generating circuit; and a controlling chip that controls the controlled chips, wherein the controlling chip includes an unused chip information holding circuit that stores therein unused chip information of the controlled chips, and each of the controlled chips receives corresponding one of the unused chip information from the unused chip information holding circuit, inactivates the internal voltage generating circuit when the unused chip information indicates an unused state, and activates the internal voltage generating circuit when the unused chip information indicates a used state.

According to the present invention, because corresponding internal voltage generating circuits are not activated in unused controlled chips, unnecessary power consumption by the internal voltage generating circuit itself is reduced, and a leakage current produced in the unused controlled chips is also reduced. With this configuration, total power consumption of a semiconductor system can be reduced according to the number of unused controlled chips.

BRIEF DESCRIPTION OF THE DRAWINGS

The above features and advantages of the present invention will be more apparent from the following description of certain preferred embodiments taken in conjunction with the accompanying drawings, in which:

FIG. 8 is a waveform diagram showing an example of variations in an internal voltage when the power is turned on;

DETAILED DESCRIPTION OF THE EMBODIMENTS

Preferred embodiments of the present invention will be explained below in detail with reference to the accompanying drawings.

Figure 1:
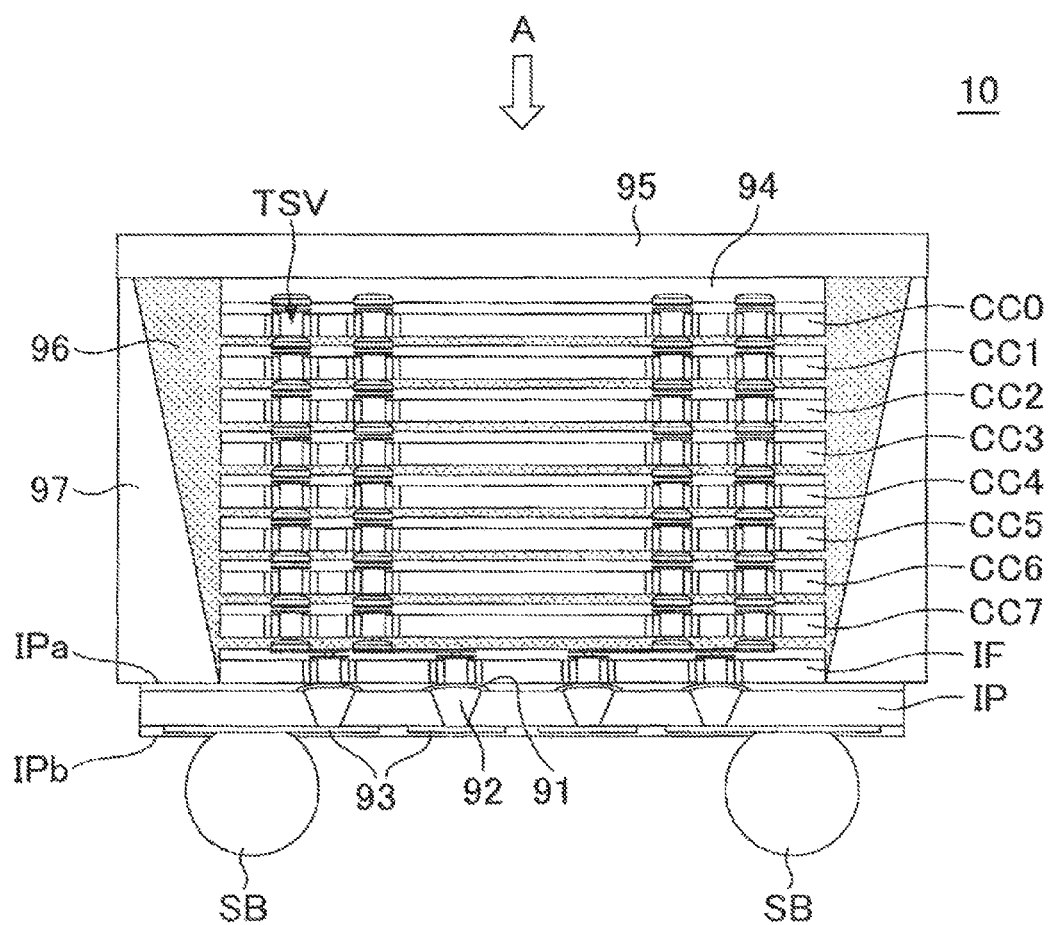
FIG. 1 is a schematic cross-sectional view showing the structure of a semiconductor device 10 according to the preferred embodiment of the present invention.

FIG. 1 is a schematic cross-sectional view provided to explain the structure of a semiconductor memory device 10 according to the preferred embodiment of the present invention.

As shown in FIG. 1, the semiconductor memory device 10 according to this embodiment has the structure where 8 core chips CC0 to CC7 that have the same function and structure and are manufactured using the same manufacture mask, an interface chip IF that is manufactured using a manufacture mask different from that of the core chips and an interposer IP are laminated. The core chips CC0 to CC7 and the interface chip IF are semiconductor chips using a silicon substrate and are electrically connected to adjacent chips in a vertical direction through plural Through Silicon Vias (TSV) penetrating the silicon substrate. Meanwhile, the interposer IP is a circuit board that is made of a resin, and plural external terminals (solder balls) SB are formed in a back surface IPb of the interposer IF.

Each of the core chips CC0 to CC7 is a semiconductor chip which consists of circuit blocks other than a so-called front end unit (front end function) performing a function of an interface with an external device through an external terminal among circuit blocks included in a 1 Gb DDR3 (Double Data Rate 3)-type SDRAM (Synchronous Dynamic Random Access Memory). The SDRAM is a well-known and common memory chip that includes the front end unit and a so-called back end unit having a plural memory cells and accessing to the memory cells. The SDRAM operates even as a single chip and is capable to communicate directly with a memory controller. That is, each of the core chips CC0 to CC7 is a semiconductor chip where only the circuit blocks belonging to the back end unit are integrated in principle. As the circuit blocks that are included in the front end unit, a parallel-serial converting circuit (data latch circuit) that performs parallel/serial conversion on input/output data between a memory cell array and a data input/output terminal and a DLL (Delay Locked Loop) circuit that controls input/output timing of data are exemplified, which will be described in detail below. The interface chip IF is a semiconductor chip in which only the front end unit is integrated. Accordingly, an operation frequency of the interface chip is higher than an operation frequency of the core chip. Since the circuits that belong to the front end unit are not included in the core chips CC0 to CC7, the core chips CC0 to CC7 cannot be operated as the single chips, except for when the core chips are operated in a wafer state for a test operation in the course of manufacturing the core chips. The interface chip IF is needed to operate the core chips CC0 to CC7. Accordingly, the memory integration of the core chips is denser than the memory integration of a general single chip. In the semiconductor memory device 10 according to this embodiment, the interface chip has a front end function for communicating with the external device at a first operation frequency, and the plural core chips have a back end function for communicating with only the interface chip at a second operation frequency lower than the first operation frequency. Accordingly, each of the plural core chips includes a memory cell array that stores plural information, and a bit number of plural read data for each I/O (DQ) that are supplied from the plural core chips to the interface chip in parallel is plural and associated with a one-time read command provided from the interface chip to the core chips. In this case, the plural bit number corresponds to a prefetch data number to be well-known.

The interface chip IF functions as a common front end unit for the eight core chips CC0 to CC7. Accordingly, all external accesses are performed through the interface chip IF and inputs/outputs of data are also performed through the interface chip IF. In this embodiment, the interface chip IF is disposed between the interposer IP and the core chips CC0 to CC7. However, the position of the interface chip IF is not restricted in particular, and the interface chip IF may be disposed on the core chips CC0 to CC7 and may be disposed on the back surface IPb of the interposer IP. When the interface chip IF is disposed on the core chips CC0 to CC7 in a face-down manner or is disposed on the back surface IPb of the interposer IP in a face-up manner, the through silicon via TSV does not need to be provided in the interface chip IF. The interface chip IF may be disposed to be interposed between the two interposers IP.

The interposer IP functions as a rewiring substrate to increase an electrode pitch and secures mechanical strength of the semiconductor memory device 10. That is, an electrode 91 that is formed on a top surface IPa of the interposer IP is drawn to the back surface IPb via a through-hole electrode 92 and the pitch of the external terminals SB is enlarged by the rewiring layer 93 provided on the back surface IPb. In FIG. 1, only the two external terminals SB are shown. In actuality, however, three or more external terminals are provided. The layout of the external terminals SB is the same as that of the DDR3-type SDRAM that is determined by the regulation. Accordingly, the semiconductor memory device can be treated as one DDR3-type SDRAM from the external controller.

As shown in FIG. 1, a top surface of the uppermost core chip CC0 is covered by an NCF (Non-Conductive Film) 94 and a lead frame 95. Gaps between the core chips CC0 to CC7 and the interface chip IF are filled with an underfill 96 and surrounding portions of the gaps are covered by a sealing resin 97. Thereby, the individual chips are physically protected.

Figure 2A:
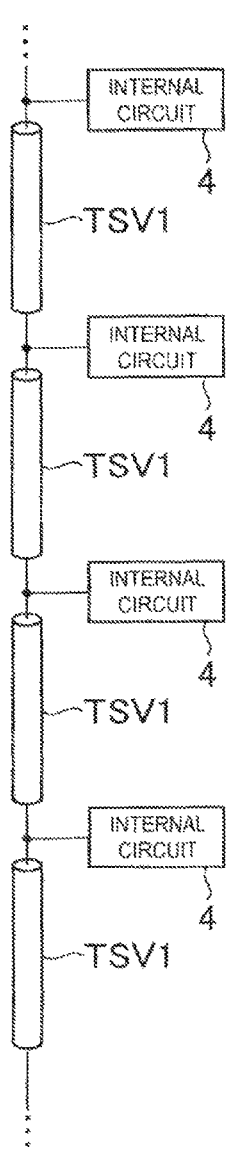
FIGS. 2A to 2C are diagram showing the various types of a through silicon via TSV provided in a core chip.

When most of the through silicon vias TSV provided in the core chips CC0 to CC7 are two-dimensionally viewed from a lamination direction, that is, viewed from an arrow A shown in FIG. 1, the through silicon vias TSV are short-circuited from the through silicon vias TSV of other layers provided at the same position. That is, as shown in FIG. 2A, the vertically disposed through silicon vias TSV1 that are provided at the same position in plain view are short-circuited, and one wiring line is configured by the through silicon via TSV1. The through silicon via TSV1 that are provided in the core chips CC0 to CC7 are connected to internal circuits 4 in the core chips, respectively. Accordingly, input signals (command signal, address signal, etc.) that are supplied from the interface chip IF to the through silicon vias TSV1 shown in FIG. 2A are commonly input to the internal circuits 4 of the core chips CC0 to CC7. Output signals (data etc.) that are supplied from the core chips CC0 to CC7 to the through silicon via TSV1 are wired-ORed and input to the interface chip IF.

Figure 2B:
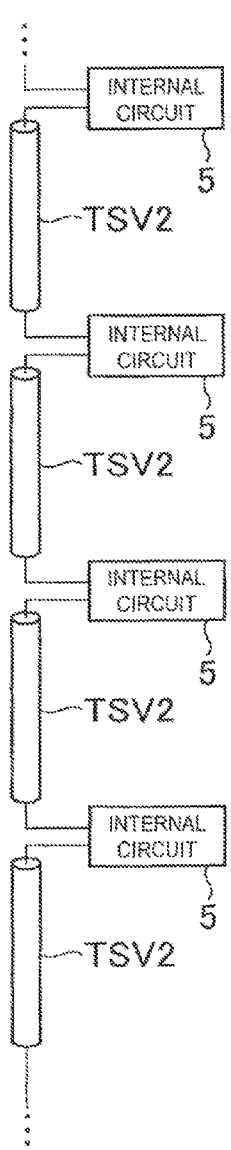

Meanwhile, as shown in FIG. 2B, the a part of through silicon vias TSV are not directly connected to the through silicon via TSV2 of other layers provided at the same position in plain view but are connected to the through silicon via TSV2 of other layers through the internal circuits 5 provided in the core chips CC0 to CC7. That is, the internal circuits 5 that are provided in the core chips CC0 to CC7 are cascade-connected through the through silicon via TSV2. This kind of through silicon via TSV2 is used to sequentially transmit predetermined information to the internal circuits 5 provided in the core chips CC0 to CC7. As this information, layer address information to be described below is exemplified.

Figure 2C:
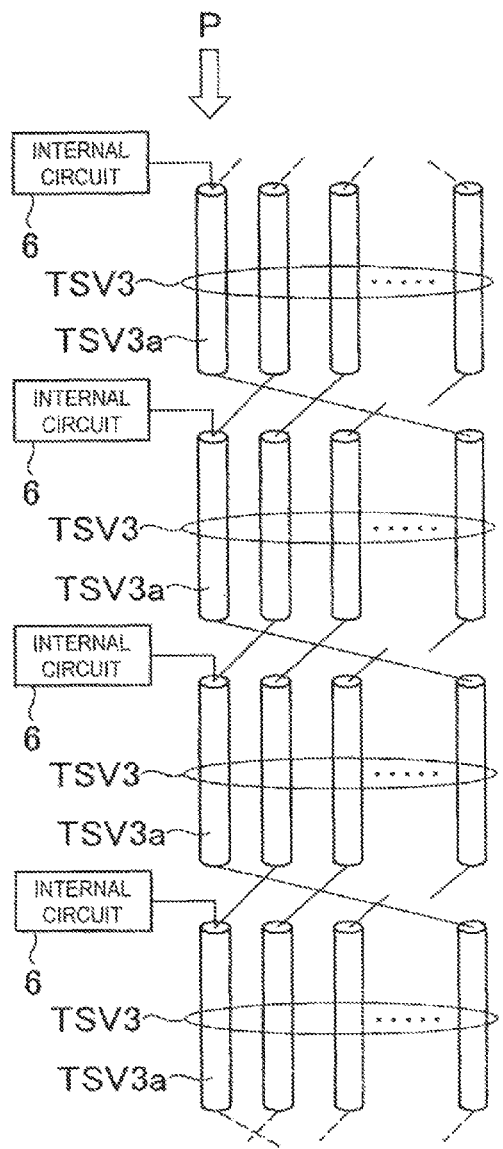

Another through silicon via group is short-circuited from the through silicon vias TSV of other layer provided at the different position in plan view, as shown in FIG. 2C. With respect to this kind of through silicon via group 3, internal circuits 6 of the core chips CC0 to CC7 are connected to the through silicon via TSV3a provided at the predetermined position P in plain view. Thereby, information can be selectively input to the internal circuits 6 provided in the core chips. As this information, defective chip information to be described below is exemplified.

As such, as types of the through silicon vias TSV provided in the core chips CC0 to CC7, three types (through silicon via TSV1 to through silicon via TSV3) shown in FIGS. 2A to 2C exist. As described above, most of the Through silicon vias TSV are of a type shown in FIG. 2A, and an address signal, a command signal, and a clock signal are supplied from the interface chip IF to the core chips CC0 to CC7, through the through silicon via TSV1 of the type shown in FIG. 2A. Read data and write data are input to and output from the interface chip IF through the through silicon via TSV1 of the type shown in FIG. 2A. Meanwhile, the through silicon via TSV2 and through silicon via TSV3 of the types shown in FIGS. 2B and 2C are used to provide individual information to the core chips CC0 to CC7 having the same structure.

Figure 3:
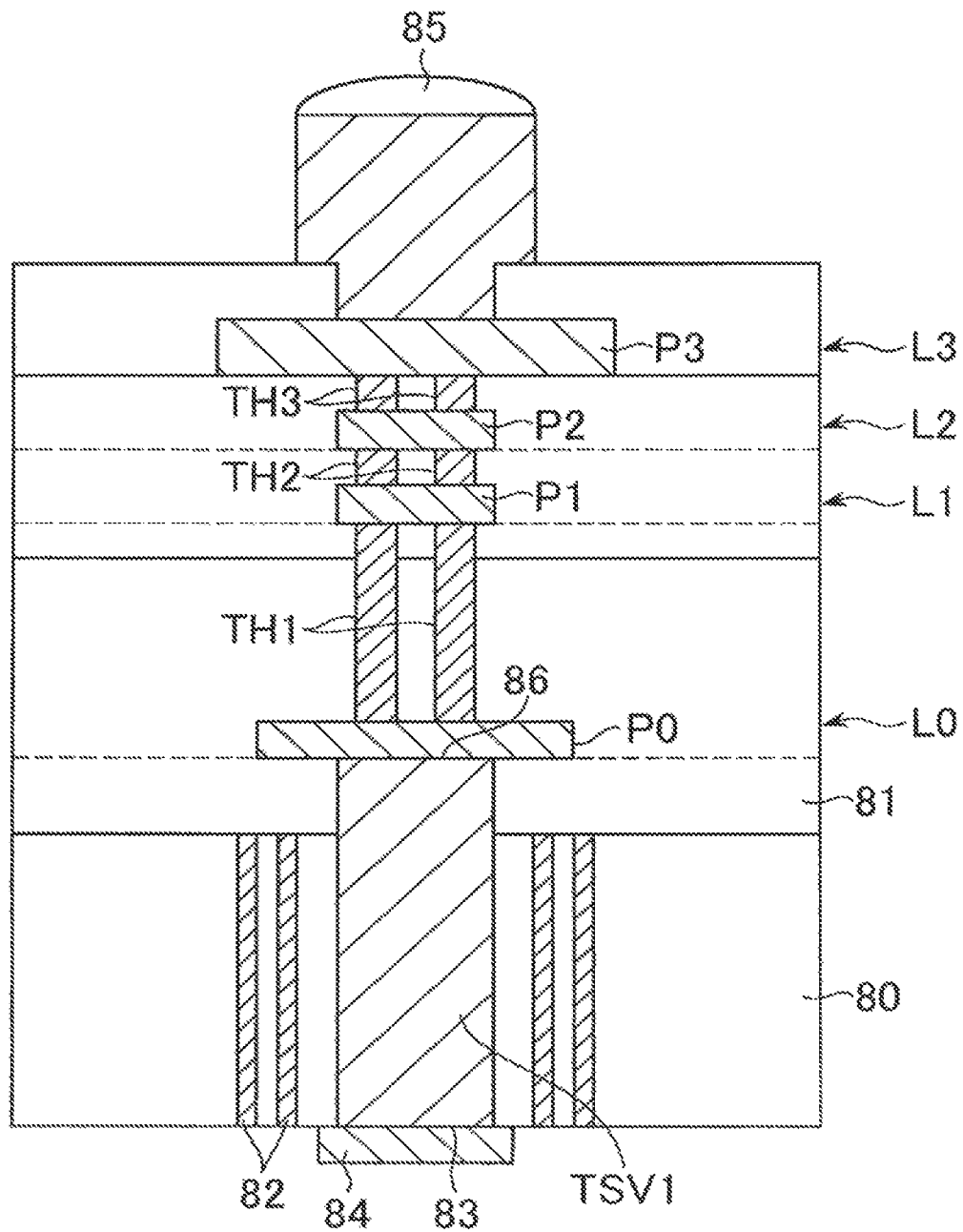
FIG. 3 is a cross-sectional view showing the structure of the through silicon via TSV1 of the type shown in FIG. 2A.

FIG. 3 is a cross-sectional view showing the structure of the through silicon via TSV1 of the type shown in FIG. 2A.

As shown in FIG. 3, the through silicon via TSV1 is provided to penetrate a silicon substrate 80 and an interlayer insulating film 81 provided on a surface of the silicon substrate 80. Around the through silicon via TSV1, an insulating ring 82 is provided. Thereby, the through silicon via TSV1 and a transistor region are insulated from each other. In an example shown in FIG. 3, the insulating ring 82 is provided double. Thereby, capacitance between the through silicon via TSV1 and the silicon substrate 80 is reduced.

An end 83 of the through silicon via TSV1 at the back surface of the silicon substrate 80 is covered by a back surface bump 84. The back surface bump 84 is an electrode that contacts a surface bump 85 provided in a core chip of a lower layer. The surface bump 85 is connected to an end 86 of the through silicon via TSV1, through plural pads P0 to P3 provided in wiring layers L0 to L3 and plural through-hole electrodes TH1 to TH3 connecting the pads to each other. Thereby, the surface bump 85 and the back surface bump 84 that are provided at the same position in plain view are short-circuited. Connection with internal circuits (not shown in the drawings) is performed through internal wiring lines (not shown in the drawings) drawn from the pads P0 to P3 provided in the wiring layers L0 to L3.

Figure 4:
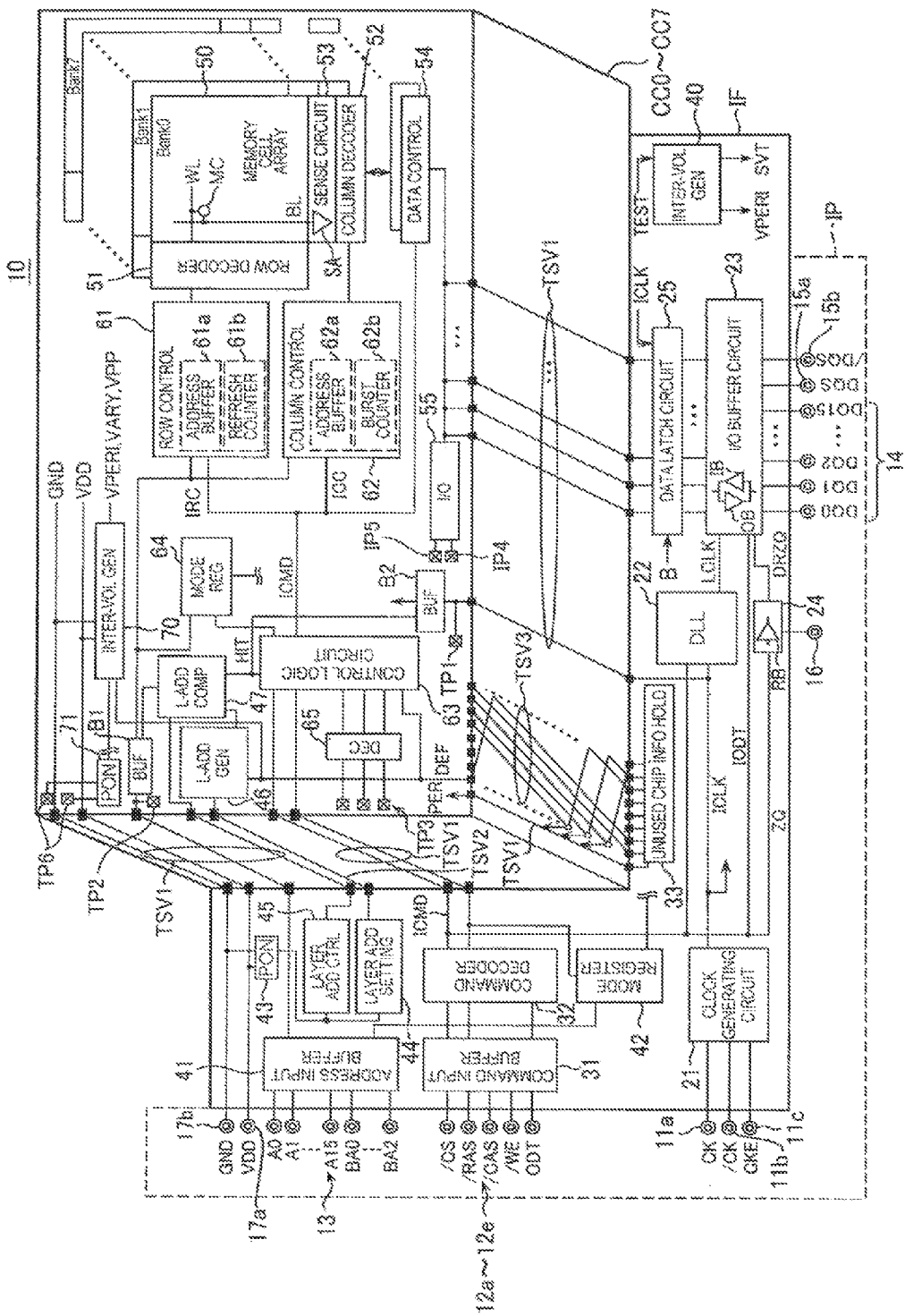
FIG. 4 is a block diagram showing the circuit configuration of the semiconductor device 10.

FIG. 4 is a block diagram showing the circuit configuration of the semiconductor memory device 10.

As shown in FIG. 4, the external terminals that are provided in the interposer IP include clock terminals 11a and 11b, an clock enable terminal 11c, command terminals 12a to 12e, an address terminal 13, a data input/output terminal 14, data strobe terminals 15a and 15b, a calibration terminal 16, and power supply terminals 17a and 17b. All of the external terminals are connected to the interface chip IF and are not directly connected to the core chips CC0 to CC7, except for the power supply terminals 17a and 17b.

First, a connection relationship between the external terminals and the interface chip IF performing the front end function and the circuit configuration of the interface chip IF will be described.

The clock terminals 11a and 11b are supplied with external clock signals CK and /CK, respectively, and the clock enable terminal 11c is supplied with a clock enable signal CKE. The external clock signals CK and /CK and the clock enable signal CKE are supplied to a clock generating circuit 21 provided in the interface chip IF. A signal where "/" is added to a head of a signal name in this specification indicates an inversion signal of a corresponding signal or a low-active signal. Accordingly, the external clock signals CK and /CK are complementary signals. The clock generating circuit 21 generates an internal clock signal ICLK, and the generated internal clock signal ICLK is supplied to various circuit blocks in the interface chip IF and is commonly supplied to the core chips CC0 to CC7 through the through silicon vias TSV.

A DLL circuit 22 is included in the interface chip IF and an input/output clock signal LCLK is generated by the DLL circuit 22. The input/output clock signal LCLK is supplied to an input/output buffer circuit 23 included in the interface chip IF. A DLL function is used to control the front end unit by using the signal LCLK synchronized with a signal of the external device, when the semiconductor memory device 10 communicates with the external device. Accordingly, DLL function is not needed for the core chips CC0 to CC7 as the back end.

The command terminals 12a to 12e are supplied with a row-address strobe signal /RAS, a column address strobe signal /CAS, a write enable signal /WE, a chip select signal /CS, and an on-die termination signal ODT. These command signals are supplied to a command input buffer 31 that is provided in the interface chip IF. The command signals supplied to the command input buffer 31 are further supplied to a command decoder 32. The command decoder 32 is a circuit that holds, decodes, and counts the command signals in synchronization with the internal clock ICLK and generates various internal commands ICMD. The generated internal command ICMD is supplied to the various circuit blocks in the interface chip IF and is commonly supplied to the core chips CC0 to CC7 through the through silicon vias TSV.

The address terminal 13 is a terminal to which address signals A0 to A15 and BA0 to BA2 are supplied, and the supplied address signals A0 to A15 and BA0 to BA2 are supplied to an address input buffer 41 provided in the interface chip IF. An output of the address input buffer 41 is commonly supplied to the core chips CC0 to CC7 through the through silicon vias TSV. The address signals A0 to A15 are supplied to a mode register 42 provided in the interface chip IF, when the semiconductor memory device 10 enters a mode register set. The address signals BA0 to BA2 (bank addresses) are decoded by an address decoder (not shown in the drawings) provided in the interface chip IF, and a bank selection signal B that is obtained by the decoding is supplied to a data latch circuit 25. This is because bank selection of the write data is performed in the interface chip IF.

The data input/output terminal 14 is used to input/output read data or write data DQ0 to DQ15. The data strobe terminals 15a and 15b are terminals that are used to input/output strobe signals DQS and /DQS. The data input/output terminal 14 and the data strobe terminals 15a and 15b are connected to the input/output buffer circuit 23 provided in the interface chip IF. The input/output buffer circuit 23 includes an input buffer IB and an output buffer OB, and inputs/outputs the read data or the write data DQ0 to DQ15 and the strobe signals DOS and /DQS in synchronization with the input/output clock signal. LCLK supplied from the DLL circuit 22. If an internal on-die termination signal IODT is supplied from the command decoder 32, the input/output buffer circuit 23 causes the output buffer OB to function as a termination resistor. An impedance code DRZQ is supplied from the calibration circuit 24 to the input/output buffer circuit 23. Thereby, impedance of the output buffer OB is designated. The input/output buffer circuit 23 includes a well-known FIFO circuit.

The calibration circuit 24 includes a replica buffer RB that has the same circuit configuration as the output buffer OB. If the calibration signal ZQ is supplied from the command decoder 32, the calibration circuit 24 refers to a resistance value of an external resistor (not shown in the drawings) connected to the calibration terminal 16 and performs a calibration operation. The calibration operation is an operation for matching the impedance of the replica buffer RB with the resistance value of the external resistor, and the obtained impedance code DRZQ is supplied to the input/output buffer circuit 23. Thereby, the impedance of the output buffer OB is adjusted to a desired value.

The input/output buffer circuit 23 is connected to a data latch circuit 25. The data latch circuit 25 includes a FIFO circuit (not shown in the drawings) that realizes a FIFO function which operates by latency control realizing the well-known DDR function and a multiplexer MUX (not shown in the drawings). The input/output buffer circuit 23 converts parallel read data, which is supplied from the core chips CC0 to CC7, into serial read data, and converts serial write data, which is supplied from the input/output buffer, into parallel write data. Accordingly, the data latch circuit 25 and the input/output buffer circuit 23 are connected in serial and the data latch circuit 25 and the core chips CC0 to CC7 are connected in parallel. In this embodiment, each of the core chips CC0 to CC7 is the back end unit of the DDR3-type SDRAM and a prefetch number is 8 bits. The data latch circuit 25 and each banks of the core chips CC0 to CC7 are connected respectively, and the number of banks that are included in each of the core chips CC0 to CC7 is 8. Accordingly, connection of the data latch circuit 25 and the core chips CC0 to CC7 becomes 64 bits (8 bits×8 banks) for each DQ.

Parallel data, not converted into serial data, is basically transferred between the data latch circuit 25 and the core chips CC0 to CC7. That is, in a common SDRAM (in the SDRAM, a front end unit and a back end unit are constructed in one chip), between the outside of the chip and the SDRAM, data is input/output in serial (that is, the number of data input/output terminals is one for each DQ). However, in the core chips CC0 to CC7, an input/output of data between the interface chip IF and the core chips is performed in parallel. This point is the important difference between the common SDRAM and the core chips CC0 to CC7. In other words, the number of bits of unit internal data simultaneously input and output between the core chips CC0 to CC7 and the interface chip IF is greater than the number of bits of unit external data simultaneously input and output between the interface chip IF and outside. However, all of the prefetched parallel data do not need to be input/output using the different through silicon vias TSV, and partial parallel/serial conversion may be performed in the core chips CC0 to CC7 and the number of through silicon vias TSV that are needed for each DQ may be reduced. For example, all of data of 64 bits for each DQ do not need to be input/output using the different through silicon vias TSV, and 2-bit parallel/serial conversion may be performed in the core chips CC0 to CC7 and the number of through silicon vias TSV that are needed for each DQ may be reduced to ½ (32).

To the data latch circuit 25, a function for enabling a test in an interface chip unit is added. The interface chip does not have the back end unit. For this reason, the interface chip cannot be operated as a single chip in principle. However, if the interface chip never operates as the single chip, an operation test of the interface chip in a wafer state may not be performed. This means that the semiconductor memory device 10 cannot be tested in case an assembly process of the interface chip and the plural core chips is not executed, and the interface chip is tested by testing the semiconductor memory device 10. In this case, when a defect that cannot be recovered exists in the interface chip, the entire semiconductor memory device 10 is not available. In consideration of this point, in this embodiment, a portion of a pseudo back end unit for a test is provided in the data latch circuit 25, and a simple memory function is enabled at the time of a test.

The power supply terminals 17a and 17b are terminals to which power supply potentials VDD and VSS are supplied, respectively. The power supply terminals 17a and 17b are connected to a power-on detecting circuit 43 provided in the interface chip IF and are also connected to the core chips CC0 to CC7 through the through silicon vias TSV. The power-on detecting circuit 43 detects the supply of power. On detecting the supply of power, the power-on detecting circuit 43 activates a layer address control circuit 45 on the interface chip IF.

The layer address control circuit 45 changes a layer address due to the I/O configuration of the semiconductor device 10 according to the present embodiment. As described above, the semiconductor memory device 10 includes 16 data input/output terminals 14. Thereby, a maximum I/O number can be set to 16 bits (DQ0 to DQ15). However, the I/O number is not fixed to 16 bits and may be set to 8 bits (DQ0 to DQ7) or 4 bits (DQ0 to DQ3). The address allocation is changed according to the I/O number and the layer address is also changed. The layer address control circuit 45 changes the address allocation according to the I/O number and is commonly connected to the core chips CC0 to CC7 through the through silicon vias TSV.

The interface chip IF is also provided with a layer address setting circuit 44. The layer address setting circuit 44 is connected to the core chips CC0 to CC7 through the through silicon vias TSV. The layer address setting circuit 44 is cascade-connected to the layer address generating circuit 46 of the core chips CC0 to CC7 using the through silicon via TSV2 of the type shown in FIG. 2B, and reads out the layer addresses set to the core chips CC0 to CC7 at testing.

The interface chip IF is also provided with an unused chip information holding circuit 33. When a defective core chip that does not normally operates is discovered after an assembly, the unused chip information holding circuit 33 holds its chip number. The defective chip information holding circuit 33 is connected to the core chips CC0 to CC7 through the through silicon vias TSV. The defective chip information holding circuit 33 is connected to the core chips CC0 to CC7 while being shifted, using the through silicon via TSV3 of the type shown in FIG. 2C.

The above description is the outline of the connection relationship between the external terminals and the interface chip IF and the circuit configuration of the interface chip IF. Next, the circuit configuration of the core chips CC0 to CC7 will be described.

As shown in FIG. 4, memory cell arrays 50 that are included in the core chips CC0 to CC7 performing the back end function are divided into eight banks. A bank is a unit that can individually receive a command. That is, the individual banks can be independently and nonexclusively controlled. From the outside of the semiconductor memory device 10, each back can be independently accessed. For example, a part of the memory cell array 50 belonging to the bank 1 and another part of the memory cell array 50 belonging to the bank 2 are controlled nonexclusively. That is, word lines WL and bit lines BL corresponding to each banks respectively are independently accessed at same period by different commands one another. For example, while the bank 1 is maintained to be active (the word lines and the bit lines are controlled to be active), the bank 2 can be controlled to be active. However, the external terminals (for example, plural control terminals and plural I/O terminals) of the semiconductor memory device 10 are shared. In the memory cell array 50, the plural word lines WL and the plural bit lines BL intersect each other, and memory cells MC are disposed at intersections thereof (in FIG. 4, only one word line WL, one bit line BL, and one memory cell MC are shown). The word line WL is selected by a row decoder 51. The bit line BL is connected to a corresponding sense amplifier SA in a sense circuit 53. The sense amplifier SA is selected by a column decoder 52.

The row decoder 51 is controlled by a row address supplied from a row control circuit 61. The row control circuit 61 includes an address buffer 61a that receives a row address supplied from the interface chip IF through the through silicon via TSV, and the row address that is buffered by the address buffer 61a is supplied to the row decoder 51. The address signal that is supplied through the through silicon via TSV is supplied to the row control circuit 61 through the input buffer B1. The row control circuit 61 also includes a refresh counter 61b. When a refresh signal is issued by a control logic circuit 63, a row address that is indicated by the refresh counter 61b is supplied to the row decoder 51.

The column decoder 52 is controlled by a column address supplied from a column control circuit 62. The column control circuit 62 includes an address buffer 62a that receives the column address supplied from the interface chip IF through the through silicon via TSV, and the column address that is buffered by the address buffer 62a is supplied to the column decoder 52. The column control circuit 62 also includes a burst counter 62b that counts the burst length.

The sense amplifier SA selected by the column decoder 52 is connected to the data control circuit 54 through some amplifiers (sub-amplifiers or data amplifiers or the like) which are not shown in the drawings. Thereby, read data of 8 bits (=prefetch number) for each I/O (DQ) is output from the data control circuit 54 at reading, and write data of 8 bits is input to the data control, circuit 54 at writing. The data control circuit 54 and the interface chip IF are connected in parallel through the through silicon via TSV.

The control logic circuit 63 receives an internal command ICMD supplied from the interface chip IF through the through silicon via TSV and controls the row control circuit 61 and the column control circuit 62, based on the internal command ICMD. The control logic circuit 63 is connected to a layer address comparing circuit (chip address comparing circuit) 47. The layer address comparing circuit 47 detects whether the corresponding core chip is target of access, and the detection is performed by comparing a SEL (chip selection information/third chip address) which is a part of the address signal supplied from the interface chip IF through the through silicon via TSV and a layer address LID (chip identification information/second chip address) set to the layer address generating circuit 46.

In the layer address generating circuit (chip second chip address generating circuit) 46, unique layer addresses are set to the core chips CC0 to CC7, respectively, at initialization. A method of setting the layer addresses is as follows. First, after the semiconductor memory device 10 is initialized, a minimum value (0, 0, 0) as an initial value is set to the layer address generating circuits 46 of the core chips CC0 to CC7. The layer address generating circuits 46 of the core chips CC0 to CC7 are cascade-connected using the through silicon vias TSV of the type shown in FIG. 28, and have incrementing circuits provided therein. The layer address (0, 0, 0) that is set to the layer address generating circuit 46 of the core chip CC0 of the uppermost layer is transmitted to the layer address generating circuit 46 of the second core chip CC1 through the through silicon via TSV and is incremented. As a result, a different layer address (0, 0, 1) is generated. Hereinafter, in the same way as the above case, the generated layer addresses are transmitted to the core chips of the lower layers and the layer address generating circuits 46 in the core chips increment the transmitted layer addresses. A maximum value (1, 1, 1) as a layer address is set to the layer address generating circuit 46 of the core chip CC7 of the lowermost layer. Thereby, the unique layer addresses are set to the core chips CC0 to CC7, respectively.

The layer address generating circuit 46 is provided with a unused chip signal DEF supplied from the unused chip information holding circuit 33 of the interface chip IF, through the through silicon via TSV. As the unused chip signal DEF is supplied to the individual core chips CC0 to CC7 using the through silicon via TSV3 of the type shown in FIG. 2C, the unused chip signals DEF can be supplied to the core chips CC0 to CC7, individually. The unused chip signal DEF is activated when the corresponding core chip is a defective chip. When the unused chip signal DEF is activated, the layer address generating circuit 46 transmits, to the core chip of the lower layer, a non-incremented layer address, not an incremented layer address. The unused chip signal DEF is also supplied to the layer address comparing circuit 47. When the unused chip signal DEF is in an active state, a comparison result of the layer addresses is forcibly set to a mismatch. An output of the layer address comparing circuit 47 is supplied to the control logic circuit 63. However, the control logic circuit 63 is not activated if a coincidence signal is not output. Consequently, when the comparison result indicates a mismatch, the control logic circuit 63 is stopped. Thereby, the defective core chip performs neither read operation nor write operation, even though an address signal or a command signal is input from the interface chip IF.

A partial signal is also supplied to the layer address comparing circuit 47 via the through silicon via TSV1. The partial signal is supplied from the unused chip information holding circuit 33. However, a dedicated circuit that supplies the partial signal can be provided. The partial signal is supplied to all the core chips CC0 to CC7 via the through silicon via TSV1 of the type shown in FIG. 2A, and thus a common partial signal can be supplied to all the core chips CC0 to CC7. The partial signal is a signal that is activated when the semiconductor device 10 is used as a partial product due to at least one of the core chips CC0 to CC7 being defective. When the partial signal is active, the number of bits of the layer addresses compared by the layer address comparing circuit 47 is changed to two, that is, the number of layer addresses is changed to that corresponding to the partial product.

An output of the control logic circuit 63 is also supplied to a mode register 64. When an output of the control logic circuit 63 shows a mode register set, the mode register 64 is updated by an address signal. Thereby, operation modes of the core chips CC0 to CC7 are set.

Each of the core chips CC0 to CC7 has an internal voltage generating circuit 70. The internal voltage generating circuit 70 is provided with power supply potentials VDD and VSS. The internal voltage generating circuit 70 receives these power supply potentials and generates various internal voltages. As the internal, voltages that are generated by the internal voltage generating circuit 70, an internal voltage VPERI (~VDD) for operation power of various peripheral circuits, an internal voltage VARY (<VDD) for an array voltage of the memory cell array 50, and an internal voltage VPP (>VDD) for an activation potential of the word line WL are included. Details of the internal voltage generating circuit 70 are described later. In each of the core chips CC0 to CC7, a power-on detecting circuit 71 is also provided. When the supply of power is detected, the power-on detecting circuit 71 resets various internal circuits.

The peripheral circuits in the core chips CC0 to CC7 operates in synchronization with the internal clock signal ICLK that is supplied form the interface chip IF through the through silicon via TSV. The internal clock signal ICLK supplied through the through silicon via TSV is supplied to the various peripheral circuits through the input buffer 82.

The above description is the basic circuit configuration of the core chips CC0 to CC7. In the core chips CC0 to CC7, the front end unit for an interface with the external device is not provided. Therefore the core chip cannot operate as a single chip in principle. However, if the core chip never operates as the single chip, an operation test of the core chip in a wafer state may not be performed. This means that the semiconductor memory device 10 cannot be tested, before the interface chip and the plural core chips are fully assembled. In other words, the individual core chips are tested when testing the semiconductor memory device 10. When unrecoverable defect exists in the core chips, the entire semiconductor memory device 10 is led to be unavailable. In this embodiment, in the core chips CC0 to CC7, a portion of a pseudo front end unit, for testing, that includes some test pads TP and a test front end unit of a test command decoder 65 is provided, and an address signal and test data or a command signal, can be input from the test pads TP. It is noted that the test front end unit is provided for a simple test in a wafer test, and does not have all of the front end functions in the interface chip. For example, since an operation frequency of the core chips is lower than an operation frequency of the front end unit, the test front end unit can be simply realized with a circuit that performs a test with a low frequency.

Kinds of the test pads TP are almost the same as those of the external terminals provided in the interposer IP. Specifically, the test pads include a test pad TP1 to which a clock signal is input, a test pad TP2 to which an address signal is input, a test pad TP3 to which a command signal is input, a test pad TP4 for input/output test data, a test pad TP5 for input/output a data strobe signal, and a test pad TP6 for a power supply potential.

A common external command (not decoded) is input at testing. Therefore, the test command decoder 65 is also provided in each of the core chips CC0 to CC7. Because serial test data is input and output at testing, a test input/output circuit 55 is also provided in each of the core chips CC0 to CC7.

This is the entire configuration of the semiconductor memory device 10. Because in the semiconductor memory device 10, the 8 core chips of 1 Gb are laminated, the semiconductor memory device 10 has a memory capacity of 8 Gb in total. Because the chip selection signal /CS is input to one terminal (chip selection terminal), the semiconductor memory device is recognized as a single DRAM having the memory capacity of 8 Gb, in view of the controller.

Figure 5:
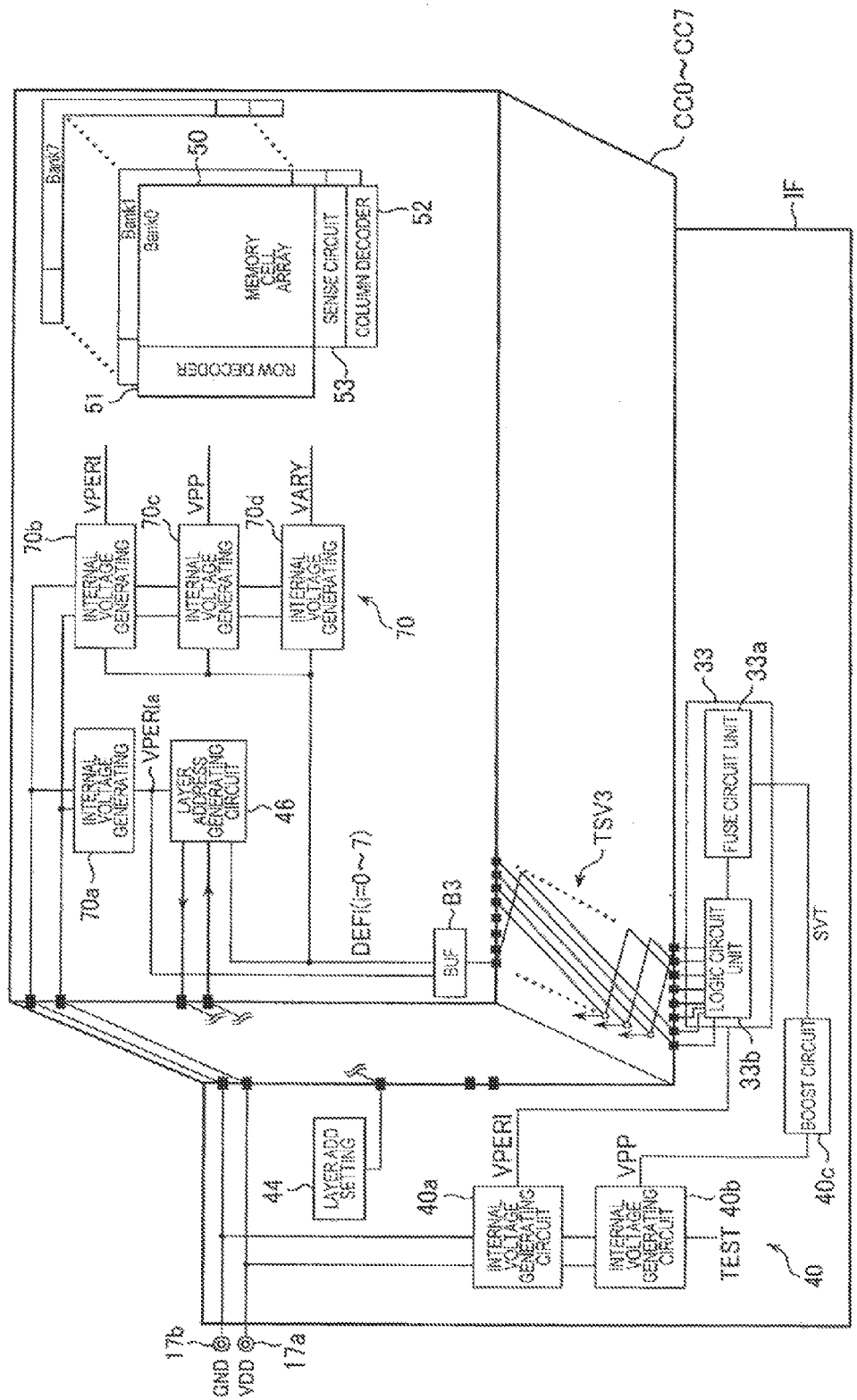
FIG. 5 is a diagram showing in detail the elements related to internal voltage generating circuits 40 and 70.

FIG. 5 is a diagram showing in detail the elements related to the internal voltage generating circuits 40 and 70 in the semiconductor device 10 according to the present embodiment.

As shown in FIG. 5, the internal voltage generating circuit 40 provided in the interface chip IF includes an internal voltage generating circuit 40a that generates an internal voltage VPERI and an internal voltage generating circuit 40b that generates an internal voltage VPP. The internal voltage VPERI is an internal voltage used as an operating voltage of almost all circuits in the interface chip IF. In the present embodiment, VPERI is set approximately equal to VDD. On the other hand, the internal voltage VPP is an internal voltage obtained by boosting the external voltage VDD (VPP>VDD) and it is supplied to a boost circuit 40c. The boost circuit 40c is a circuit that generates a super voltage SVT by further boosting the internal voltage VPP. The generated super voltage SVT (>VPP) is supplied to the unused chip information holding circuit 33.

The unused chip information holding circuit 33 includes a fuse circuit unit 33a and a logic circuit unit 33b. The super voltage SVT is used as a write voltage for writing to the fuse circuit unit 33a. Information written to the fuse circuit unit 33a is the unused chip signal DEF that indicates a defective core chip detected after assembly. The information is written to the fuse circuit unit 33a during an operation test after assembly. The internal voltage VPP is generated when a test signal TEST is activated during the operation test and supplied to the internal voltage generating circuit 40b. Thus, the internal voltage VPP is not generated and almost no power is consumed by the internal voltage generating circuit 40b during a normal operation.

The unused chip signal DEF written to the fuse circuit unit 33a is supplied to corresponding core chips CC0 to CC7 via the logic circuit unit 33b and the through silicon via TSV3 of the type shown in FIG. 2C. Because the unused chip signal DEF is supplied to each of the core chips CC0 to CC7 via the through silicon via TSV3 of the type shown in FIG. 2C, individual unused chip signals DEF0 to DEF7 are supplied to each of the core chips CC0 to CC7. When fuse elements are used corresponding to each of the unused chip signals DEF0 to DEF7, the same unused chip signals DEF0 to DEF7 are output from the fuse circuit unit 33a. Therefore, in this case, the logic circuit unit 33b can be omitted.

As shown in FIG. 5, the internal voltage generating circuit 70 arranged in the core chips CC0 to CC7 includes internal voltage generating circuits 70a and 70b that generate the internal voltage VPERI, an internal voltage generating circuit 70c that generates the internal voltage VPP, and an internal voltage generating circuit 70d that generates the internal voltage VARY. As described earlier, the internal voltage VPERI is an internal voltage used as an operating power for the various peripheral circuits, the internal voltage VPP is a driving voltage of the word line WL, and the internal voltage VARY is the array voltage of the memory cell array 50. The internal voltages VPERI generated by both the internal voltage generating circuits 70a and 70b have the same voltage level: however, an output of the internal voltage generating circuit 70a is denoted as VPERIa when it is necessary to differentiate between the two.

The internal voltage generating circuits 70a to 70d are circuits that receive the external voltage VDD and an external voltage GND supplied from the interface chip IF via the through silicon via TSV1 and generate the relevant internal voltages. The generated internal voltages are used only within the respective core chips CC0 to CC7. That is, the internal voltages generated in the core chips CC0 to CC7 are electrically separated from each other and they are not shared among a plurality of core chips.

The internal voltage generating circuit 70a is a circuit that supplies the internal voltage VPERI to the layer address generating circuit 46 and a buffer B3, and it is activated whenever the power is turned on. The layer address generating circuit 46 is a circuit that generates a layer address of the respective core chips CC0 to CC7, and the buffer B3 is a circuit that performs buffering of the unused chip signal DEF supplied via the through silicon via TSV3 and supplies the unused chip signal DEF to the layer address generating circuit 46. Because the layer address generating circuit 46 and the buffer B3 have to perform operations regardless of whether the core chips CC0 to CC7 are defective, the internal voltage generating circuit 70a always supplies the internal voltage VPERI to the layer address generating circuit 46 and the buffer B3.

On the other hand, the internal voltage generating circuits 70b to 70d are activated or not activated depending on the corresponding unused chip signal DEF. Specifically, when the unused chip signal DEF indicates an unused state of the core chips CC0 to CC7 (when the unused chip signal DEF is active), the internal voltage generating circuits 70b to 70d are not activated. Conversely, when the unused chip signal DEF indicates a used state of the core chips CC0 to CC7 (when the unused chip signal DEF is inactive), the internal voltage generating circuits 70b to 70d are activated. Thus, in the core chips CC0 to CC7 for which the unused chip signal DEF is active, the operating power is not supplied to circuits such as the memory cell array 50, the row decoder 51, the column decoder 52, and a sense circuit 53, that is, the circuits excluding the layer address generating circuit 46 and the buffer 83. Outputs of the internal voltage generating circuits 70b to 70d that are inactive are fixed to a ground level.

Figure 6:
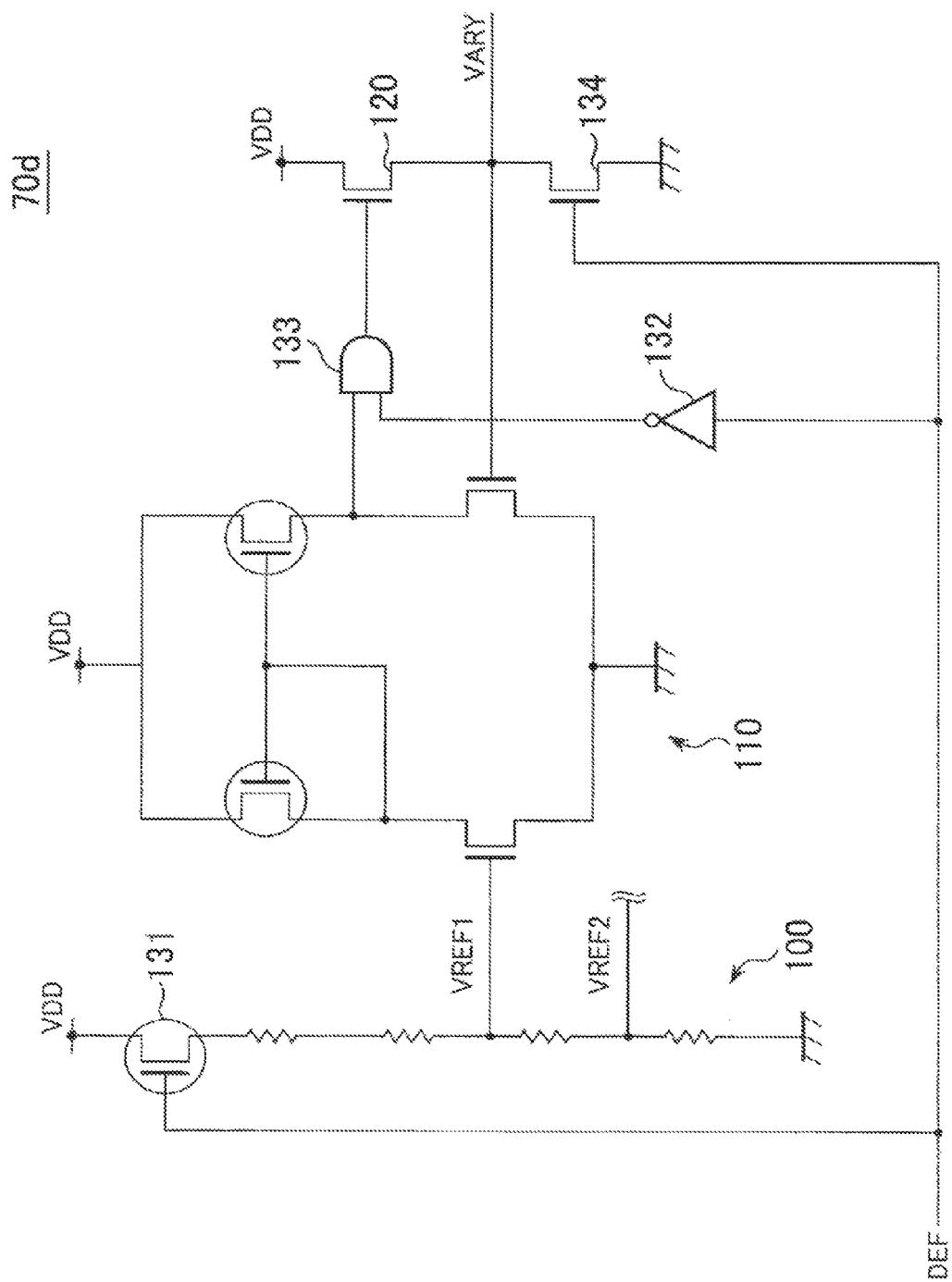
FIG. 6 is a circuit diagram of the internal voltage generating circuit 70d.

FIG. 6 is a circuit diagram of the internal voltage generating circuit 70d.

The internal voltage generating circuit 70d shown in FIG. 6 includes a resistance dividing circuit 100 that generates a reference potential VREF1, a differential circuit 110 that receives the reference potential VREF1, and an N-channel driver transistor 120 that generates the internal voltage VARY depending on an output of the differential circuit 110. A P-channel MOS transistor 131 is connected to the resistance dividing circuit 100 in series and the unused chip signal DEF is supplied to a gate electrode of the P-channel MOS transistor 131. A logic circuit including an inverter 132 and an AND gate 133 is provided between the differential circuit 110 and the driver transistor 120. Furthermore, an N-channel MOS transistor 134 is connected between an output terminal of the driver transistor 120 and ground and the unused chip signal DEF is supplied to a gate electrode of the N-channel MOS transistor 134.

With this configuration, when the unused chip signal DEF is at a low level (an inactive state), the transistor 131 is turned on and the transistor 134 is turned off. Moreover, because a gate signal of the driver transistor 120 is not interrupted due to the AND gate 133, the internal voltage generating circuit 70d generates the internal voltage VARY. On the other hand, when the unused chip signal DEF is at a high level (an active state), the transistor 131 is turned off and the transistor 134 is turned on. Moreover, because an output of the AND gate 133 is maintained at a low level, the operation of the internal voltage generating circuit 70d is stopped and the output of the internal voltage generating circuit 70d is fixed to the ground level. As a result, almost no power is consumed by the internal voltage generating circuit 70d apart from a slight leakage current. Furthermore, because the power is also not supplied to circuits (the memory cell array 50 and the like) using the internal voltage VARY, the power consumption by these circuits is almost zero. That is, because a substrate potential, a source, and a drain of each of all the elements in the circuits that use the internal voltage VARY are all at the ground level, none of these elements produce the leakage current. The internal voltage generating circuit 70d is the only circuit that releases the leakage current. However, because the number of elements and a size of the internal voltage generating circuit 70d are restricted considerably as compared to all the elements using the internal voltage VARY, the effect on the reduction of the leakage current is significant.

Figure 7:
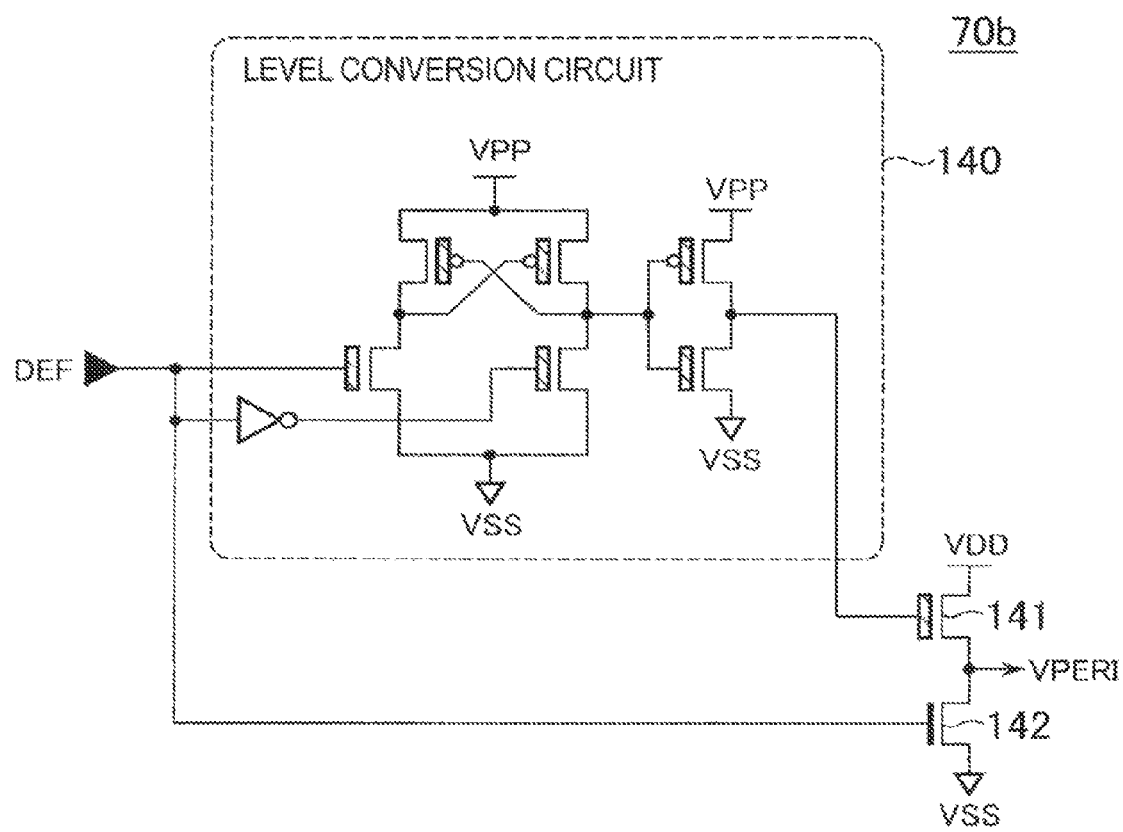
FIG. 7 is a circuit diagram of the internal voltage generating circuit 70b.

FIG. 7 is a circuit diagram of the internal voltage generating circuit 70b.

The internal voltage generating circuit 70b shown in FIG. 7 includes a level conversion circuit 140 that converts a level of the unused chip signal DEF to a VPP level, an N-channel driver transistor 141 that generates the internal voltage VPERI depending on an output of the level conversion circuit 140, and an N-channel MOS transistor 142 connected between an output terminal of the driver transistor 141 and ground. In FIG. 7, a transistor with a thick gate electrode signifies a high voltage transistor having a relatively thick gate insulation film.

With this configuration, when the unused chip signal DEF is at a low level (an inactive state), because the transistor 141 is turned on and the transistor 142 is turned off, the internal voltage generating circuit 70b generates the internal voltage VPERI. On the other hand, when the unused chip signal DEF is at a high level (an active state), because the transistor 141 is turned off and the transistor 142 is turned on, the operation of the internal voltage generating circuit 70b is stopped and an output of the internal voltage generating circuit 70b is fixed to the ground level. In this regard, the internal voltage generating circuit 70b is identical to that of the internal voltage generating circuit 70d shown in FIG. 6.

There are no particular constraints on the circuit configurations of the internal voltage generating circuits 70b to 70d as long as their activation or inactivation is controlled based on the corresponding unused chip signal DEF. However, as described in examples shown in FIGS. 6 and 7, it is preferable to fix the output of the internal voltage generating circuits 70b to 70d to the ground level when the unused chip signal DEF is active. By fixing the output of the internal voltage generating circuits 70b to 70d, the leakage current in various circuits using the relevant internal voltages can be reduced.

Figure 8:
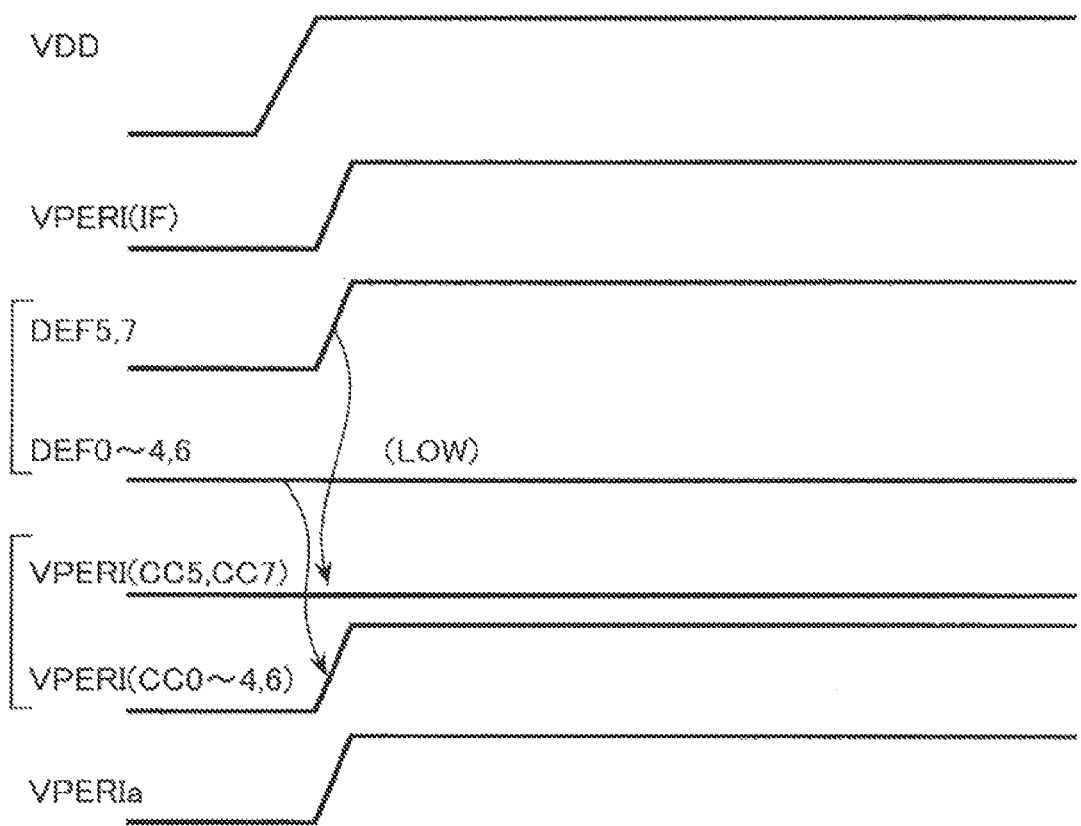

FIG. 8 is a waveform diagram showing an example of variations in the internal voltage when the power is turned on in a case where the core chips CC5 and CC7 are defective.

In this example, because the core chips CC5 and CC7 are defective, the corresponding unused chip signals DEF5 and DEF7 change to a high level when the external voltage VDD is applied. The rest of the unused chip signals DEF0 to DEF4 and DEF6 are maintained at a low level. Thus, the internal voltage VPERI is not generated in the core chips CC5 and CC7 and their output levels are fixed to the ground. The internal voltage VPERI is properly generated in the rest of the core chips CC0 to CC4 and CC6. However, because the internal voltage generating circuit 70a is activated in all the core chips CC0 to CC7 including the defective core chips CC5 and CC7, the internal voltage VPERIa, which is supplied to the layer address generating circuit 46 and the buffer B3, is properly generated in all the core chips CC0 to CC7.

In this manner, in the present embodiment, the internal voltage generating circuits 70b to 70d are inactivated in the unused core chips among the core chips CC0 to CC7. Therefore, not only the power consumption by the internal voltage generating circuits 70b to 70d is reduced but the leakage current in the various circuits using the internal voltages that are the output of the internal voltage generating circuits 70b to 70d can be also reduced.

There has been explained a case where defective core chips are treated as unused chips; however, unused chips do not always need to be defective chips, and normal chips can be intentionally treated as unused chips. A case where normal chips are treated as unused chips is explained below.

Figure 9:
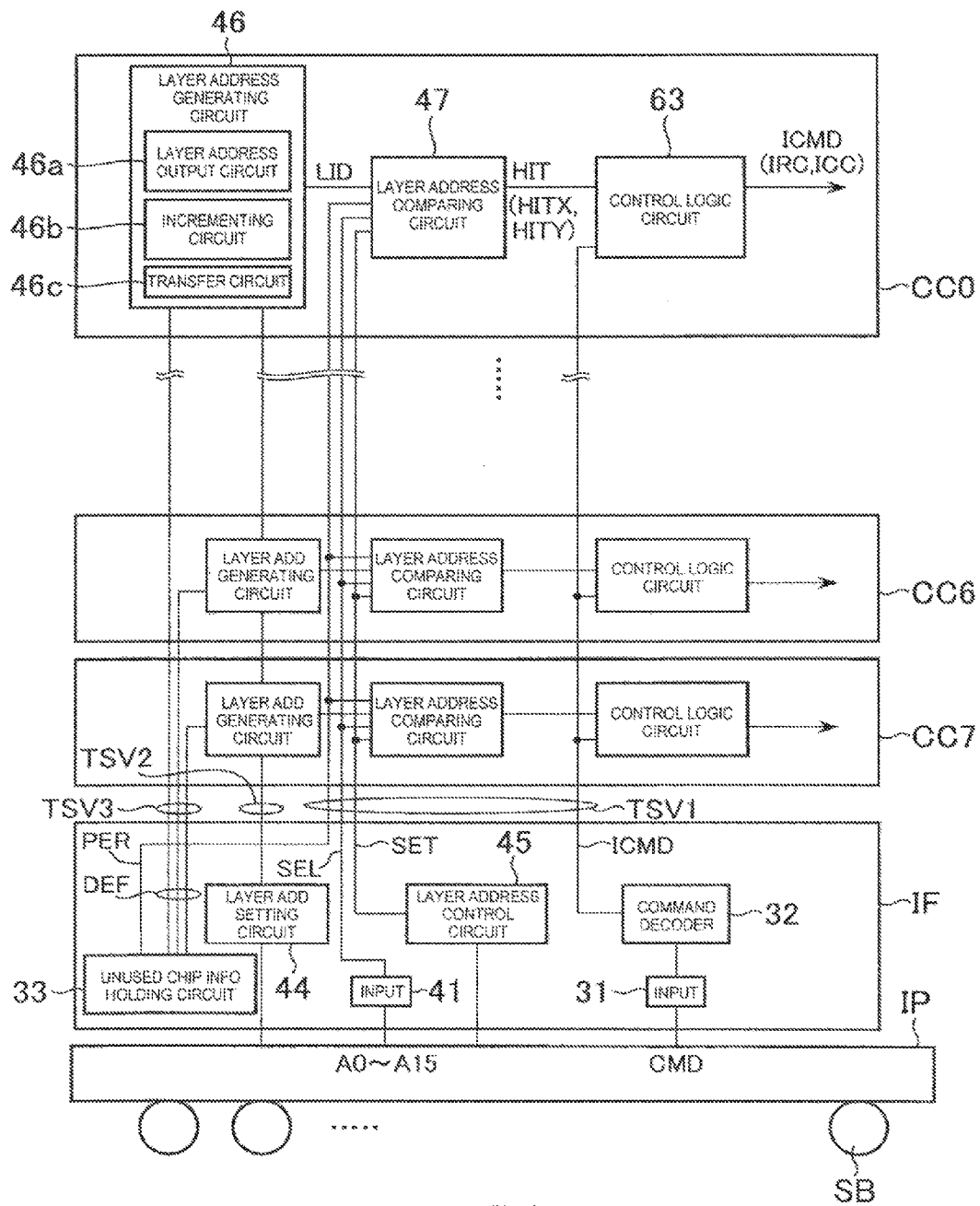
FIG. 9 is a diagram showing circuits related to selection of the core chips CC0 to CC7.
Figure 10:
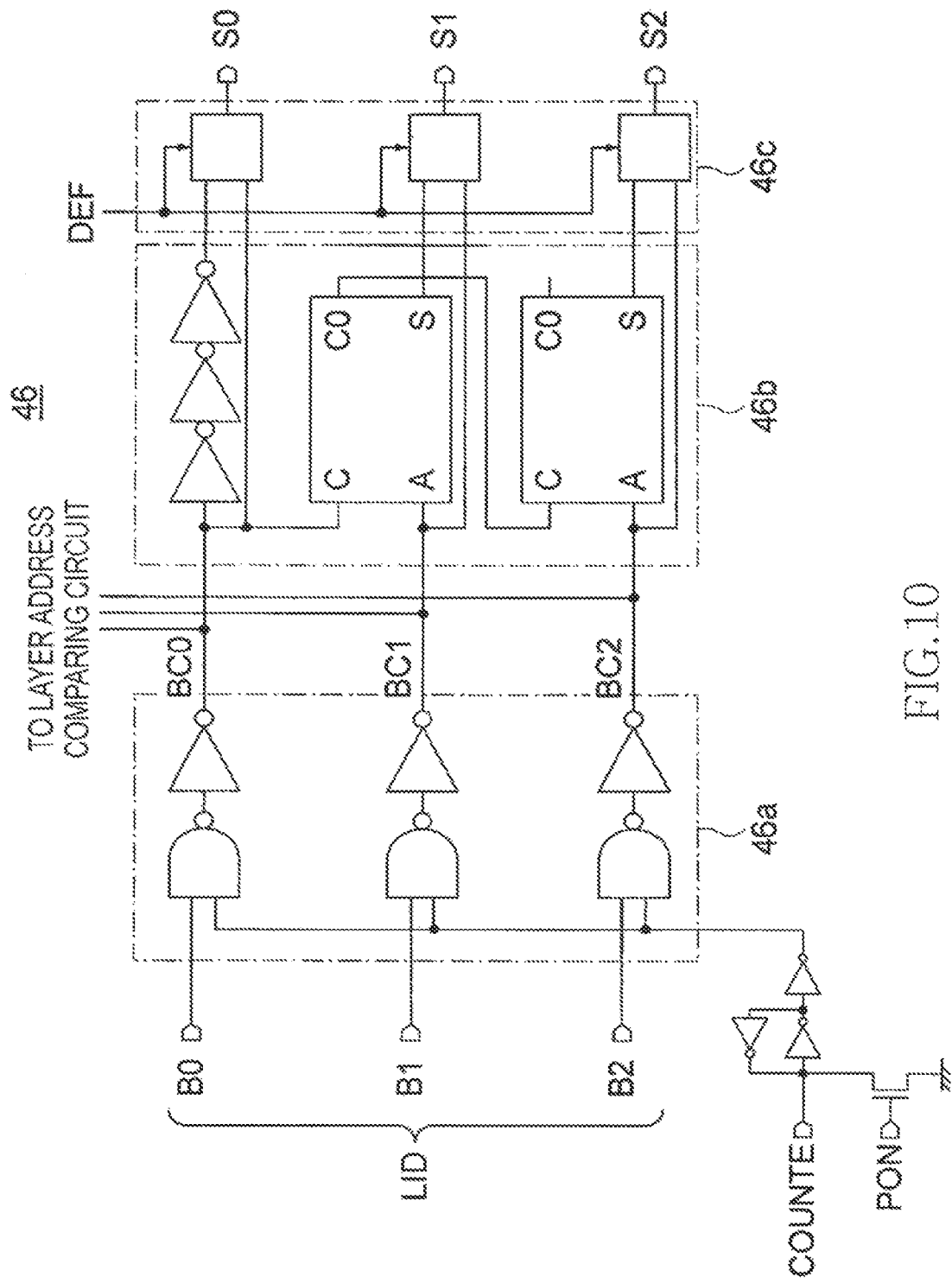
FIG. 10 is a circuit diagram showing an example of a configuration of the layer address generating circuit 46.

FIG. 9 is a diagram showing circuits related to selection of the core chips CC0 to CC7. FIG. 10 is a circuit diagram showing an example of a configuration of the layer address generating circuit 46.

As shown in FIG. 9, the layer address generating circuit (a chip address generating circuit) 46 is provided in each of the core chips CC0 to CC7 and they are cascade connected via the through silicon via TSV2 of the type shown in FIG. 2B. The layer address generating circuit 46 includes a layer address output circuit 46a, an incrementing circuit 46b, and a transfer circuit 46c.

As shown in FIG. 10, the layer address output circuit 46a is a logic circuit that outputs a 3-bit layer address (a chip identification number) LID. When a power-on reset signal PON that is supplied from the power-on detection circuit 71 shown in FIG. 4 is at a high level, the layer address output circuit 46a is reset and the chip identification number of all the core chips is reset to (0, 0, 0). Thereafter, when the power-on reset signal PON returns to a low level, a layer address LID (B2, B1, B0), which is a first chip address, is obtained from outside. In the present embodiment, the layer address LID (B2, B1, B0) is supplied from the core chip of an immediate upper layer. However, because there is no core chip above the core chip CC0 of the uppermost layer, a layer address input terminal of the core chip CC0 of the uppermost layer is open.

The layer address output circuit 46a also receives a count enable signal COUNTE. The count enable signal COUNTE of the core chip CC0 of the uppermost layer is set to a low level (open) and count enable signals COUNTE of the core chips of the other layers are set to a high level (VPERI). Thus, in case of the core chip CC0 of the uppermost layer, (0, 0, 0) is forcibly output due to the count enable signal COUNTE input into a NAND gate in the layer address output circuit 46a irrespective of a value of the layer address LID (B2, B1, B0) from outside. Furthermore, in case of the other layers, the same value of the layer address LID (B2, B1, B0) from outside passes through the NAND gate in the layer address output circuit 46a. Thus, a layer address LID (BC0, BC1, BC2) output from the layer address output circuit 46a is adopted as a layer address (a second chip address) of its own core chip, and it is supplied to the layer address comparing circuit 47.

Next, the incrementing circuit 46b outputs an incremented value of the layer address LID (BC2, BC1, BC0) of its own core chip. The incrementing circuit 46b of the core chip CC0 of the uppermost layer generates an incremented value (0, 0, 1) of the layer address LID (0, 0, 0) set in the layer address output circuit 46a, and the transfer circuit 46c transfers the value (S0, S1, S2) to the core chip CC1 of the lower layer. The transferred layer address LID (0, 0, 1) is adopted as a layer address of the core chip CC1.

Even in the core chip CC1, an incremented value (0, 1, 0) of the layer address LID (0, 0, 1) that is set in the layer address output circuit 46a and incremented by the incrementing circuit 46b is generated, and the generated incremented value (0, 1, 0) is transferred to the core chip CC2 of the lower layer by the transfer circuit 46c.

Similarly, incremented layer addresses LID are sequentially transferred to the core chips of the lower layers. As a result, finally, a maximum value (1, 1, 1) is set as a layer address LID in the layer address output circuit 46a of the lowermost core chip CC7. With this operation, a unique layer address LID is set for each of the core chips CC0 to CC7.

In the above explanations, it is assumed that all the core chips are normally functioning. However, when there is a defective chip, it is necessary to obtain a so-called partial product in which a usage of the defective chips is stopped and the normal core chips are relieved. Setting of layer addresses in a case when there is a defective chip is explained below.

As shown in FIG. 9, the layer address generating circuit 46 receives the unused chip signal DEF from the unused chip information holding circuit 33 included in the interface chip IF via the through silicon via TSV3 of the type shown in FIG. 2C. The unused chip signal DEF is an 8-bit signal and each bit is supplied to respective corresponding core chips CC0 to CC7. The core chip whose corresponding bit of the unused chip signal DEF is active is a defective chip or it is a chip that is intentionally not used in combination with a defective chip.

Figure 11:
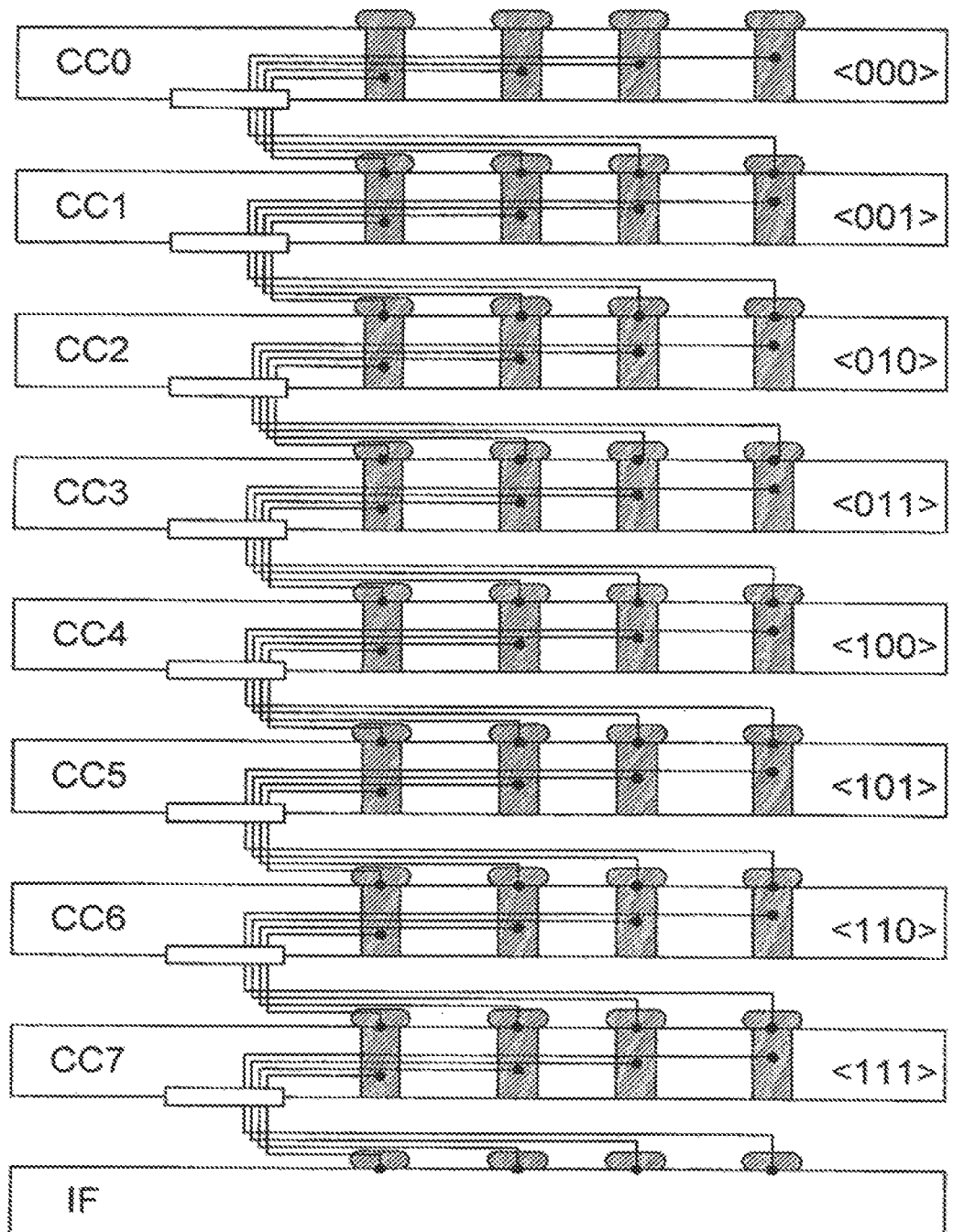
FIG. 11 is a schematic diagram showing an example of allocations of layer addresses when no defective chip exists.

As described above, in the core chip whose corresponding bit of the unused chip signal DEF is not active, the transfer circuit 46c transfers the incremented layer address LID to the core chip of the lower layer. Thus, as shown in FIG. 11, when none of the bits of the unused chip signal DEF are inactive, layer addresses (0, 0, 0) to (1, 1, 1) are sequentially allocated to the core chips CC0 to CC7 from the uppermost layer to the lowermost layer.

On the other hand, the transfer circuit 46c of the core chip whose corresponding bit of the unused chip signal DEF is active transfers to the core chip of the lower layer the non-incremented layer address LID instead of the incremented layer address LID. Therefore, allocation of the layer address LTD relative to the unused core chip is skipped and the same layer address LID as that of the core chip of the lower layer is allocated to the unused chip. That is, the layer address LID allocated to each of the core chips CC0 to CC7 is not a fixed address but it is changed according to the unused chip signal DEF. The same layer address LID as that of the core chip of the lower layer is allocated to the unused chip. However, because the control logic circuit 63 cannot be activated in the unused chip, a read operation and a write operation cannot be performed even if address signals and command signals are input from the interface chip IF.

The defective chips that are not operating normally are obviously selected as the unused chips. However, some of the normally functioning chips operating normally are selected as unused chips due to address control. Specifically, by changing the layer address to two bits instead of changing it to three bits thereby making one layer address selection line among the three layer address selection lines as unused, the layer address control is made easier. In this case, the semiconductor device 10 according to the present embodiment can be provided as a partial product of 4 GB.

Figure 12:
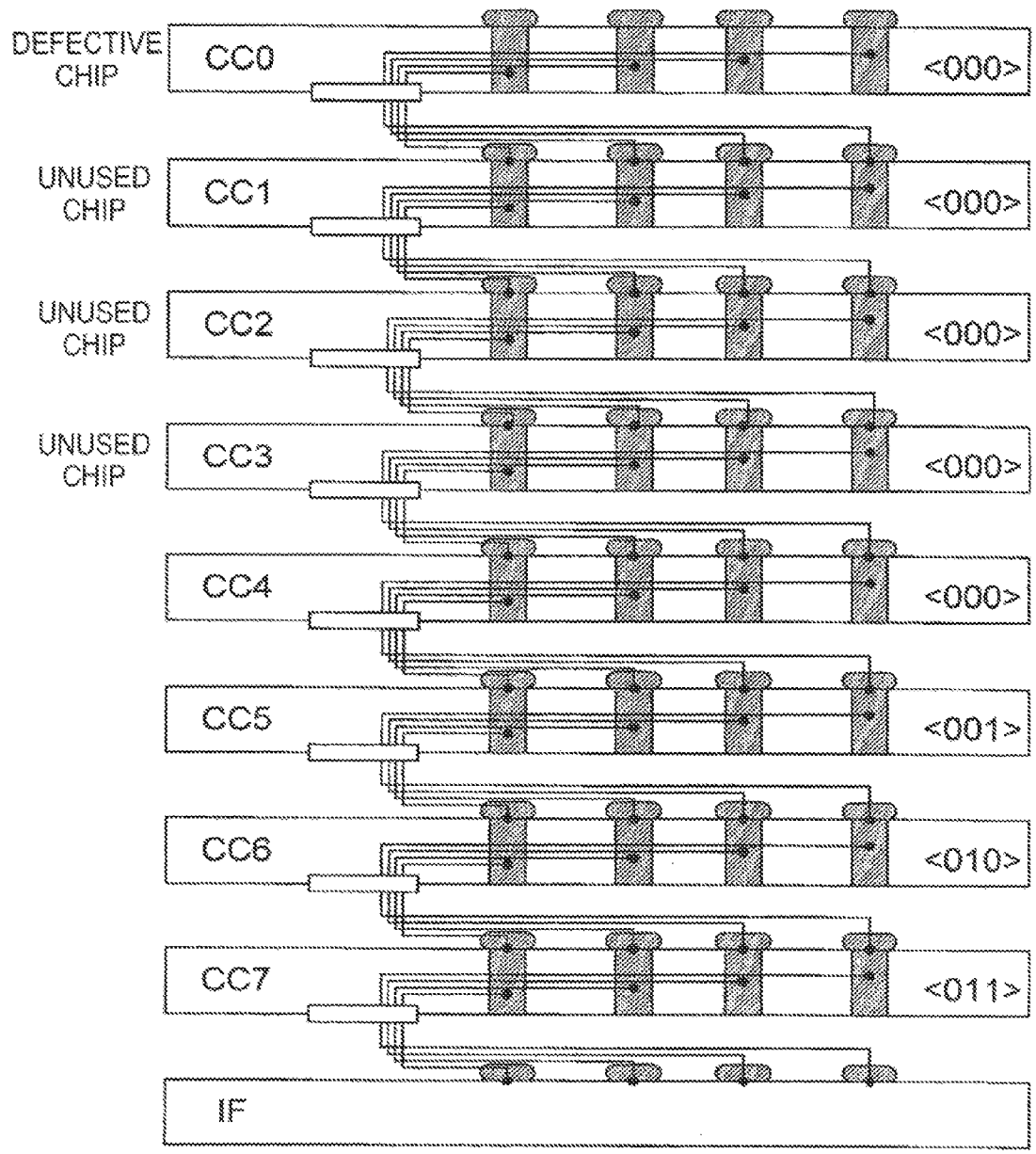
FIG. 12 is a schematic diagram showing an example of allocations of layer addresses when defective chips exist.

For example, when the core chip CC0 of the uppermost layer (the first layer) is defective, and in addition, the core chips CC1 to CC3 of the second to fourth layers are selected as the unused chips, as shown in FIG. 12, the layer address LID of all the core chips CC0 to CC4 of the first to fifth layers is (0, 0, 0). Furthermore, the layer addresses (0, 0, 1) to (0, 1, 1) are sequentially allocated to the core chips CC5 to CC7 of the sixth to eighth layers.

Figure 13:
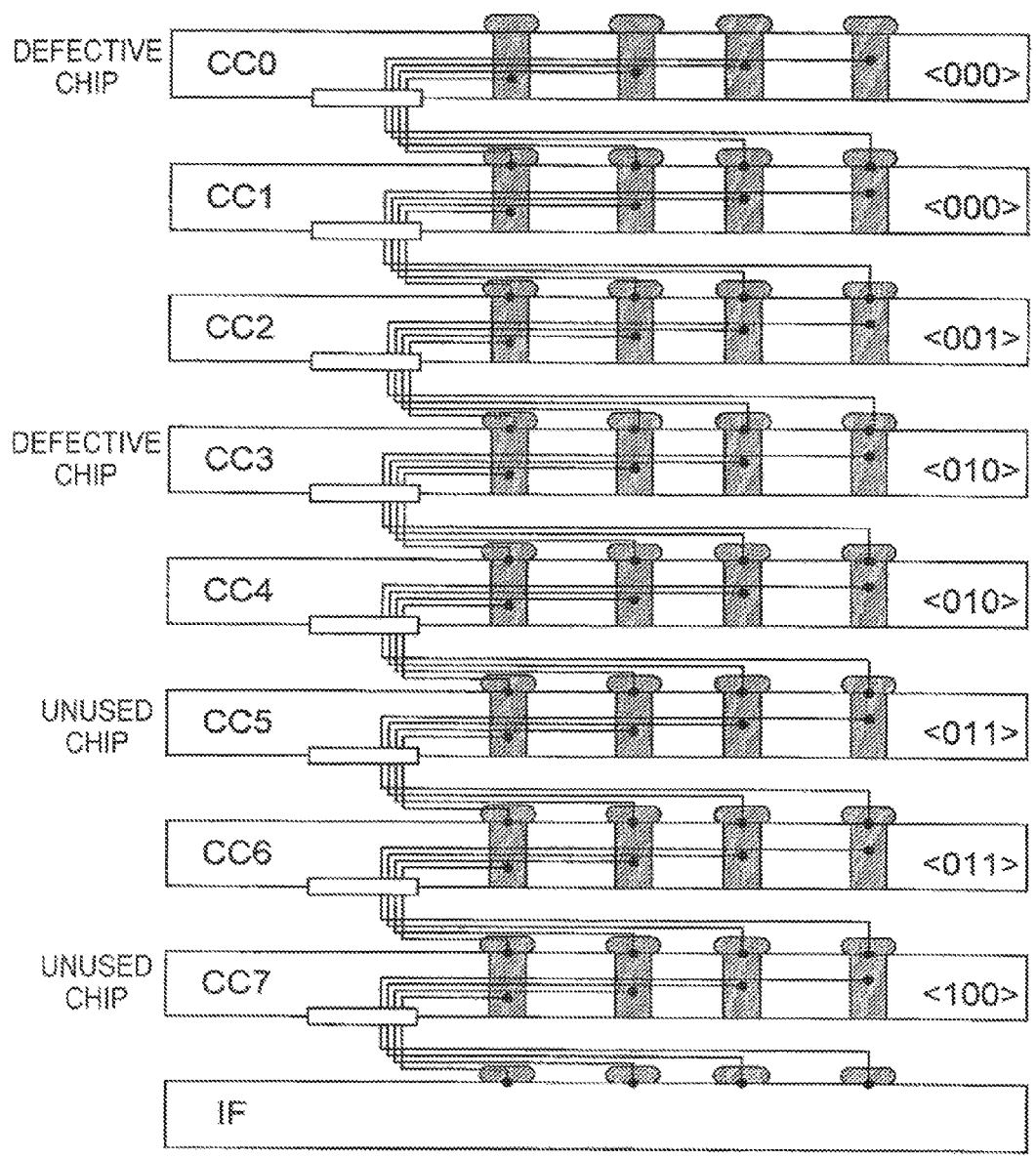
FIG. 13 is a schematic diagram showing another example of allocations of layer addresses when defective chips exist.

Meanwhile, when the core chip CC0 of the uppermost layer (the first layer) and the core chip CC3 of the fourth layer are defective, and in addition, the core chip CC5 of the sixth layer and the core chip CC7 of the eighth layer are selected as unused chips, as shown in FIG. 13, the layer address LID of the core chip CC0 of the uppermost layer and the core chip CC1 of the second layer is (0, 0, 0), the layer address LID of the core chip CC2 of the third layer is (0, 0, 1), the layer address LID of the core chip CC3 of the fourth layer and the core chip CC4 of the fifth layer is (0, 1, 0), the layer address LID of the core chip CC5 of the sixth layer and the core chip CC6 of the seventh layer is (0, 1, 1), and the layer address LID of the core chip CC7 of the eighth layer is (1, 0, 0).

It can be freely decided as to which of the core chips among the normal core chips are selected as unused chips. However, some preferred determination methods are presumed. In one such method, in view of a relief efficiency of the through silicon via TSV or a resistance of the through silicon via TSV, unused chips are selected in sequence from the core chip CC that is farthermost from the interface chip IF. For example, when any one of the core chips CC0 to CC3 of the first to fourth layers is defective, all the core chips CC0 to CC3, including the defective chip, of the first to fourth layers are selected as unused chips. Moreover, when any one of the core chips CC4 to CC7 of the fifth to eight layers is defective, in addition to this defective chip, the core chips CC0 to CC2 of the first to third layers are selected as unused chips. In another method, an unused chip is inserted between used chips to ensure that the unused chips are not stacked in succession. For example, when one of the eight core chips is defective and it is arranged on an even layer, all the core chips on even layers are selected as unused chips and all the core chips on odd layers are selected as used chips. Therefore, a distance between the activated chips increases and rise in chip temperature can be restrained. Meanwhile, the methods described above can be used in combination.

The layer address LID set as described above is supplied to the layer address comparing circuit (a chip address comparison circuit) 47 corresponding to each of the core chips CC0 to CC7. The layer address comparing circuit 47 is a circuit that compares the layer address LID (the chip identification number) supplied from the layer address generating circuit 46 with the portion of the address signal (the chip selection information) SEL supplied from the interface chip IF via the through silicon via TSV. Because the address signal is commonly supplied to all the core chips CC0 to CC7 via the through silicon via TSV1 of the type shown in FIG. 2A, the layer address comparing circuit 47 detects only one matching core chip.

Figure 14:
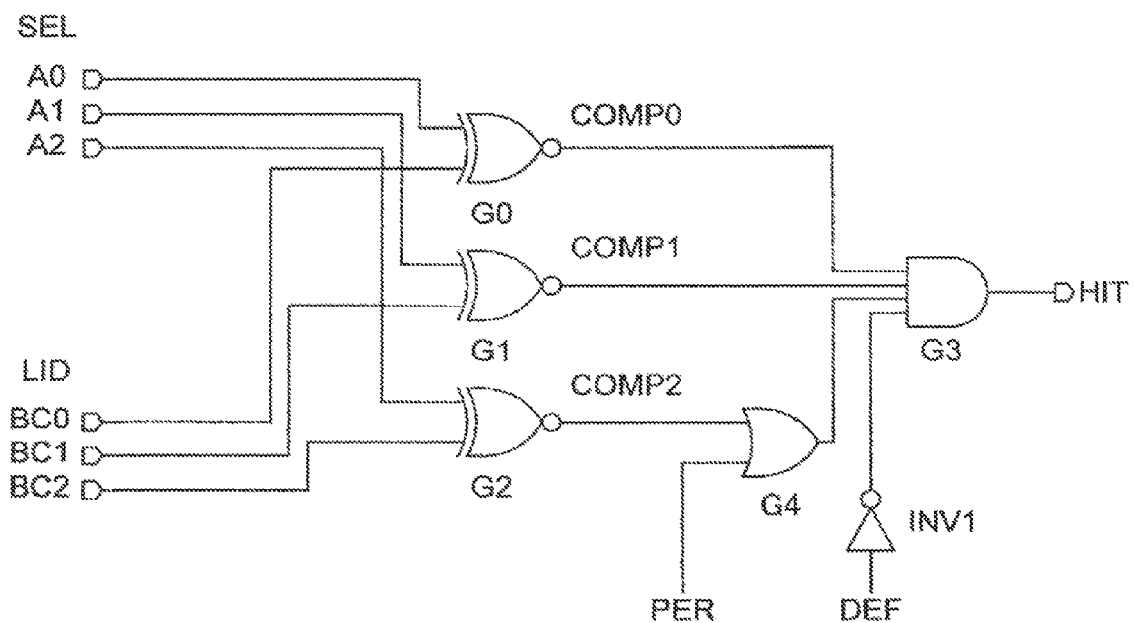
FIG. 14 is a circuit diagram showing a configuration of the layer address comparing circuit 47.

FIG. 14 is a circuit diagram showing a configuration of the layer address comparing circuit 47.

As shown in FIG. 14, the layer address comparing circuit 47 receives each bit (A2, A1, A0) of the chip selection information SEL and each bit (BC2, BC1, BC0) of the layer address LID. The layer address comparing circuit 47 includes ENOR gate circuits G0 to G2 that, respectively, compare corresponding bits of the output signals, and an AND gate circuit G3 that receives output signals COMP0 to COMP2 of the ENOR gate circuits G0 to G2. An output of the AND gate circuit G3 is used as a coincidence signal HIT.

When the partial product is used in which four chips are unused chips, a partial signal PER commonly supplied to the core chips CC0 to CC7 is activated to a high level. The partial signal PER as well as the output signal COMP2 are input into an OR gate circuit (a partial gate) G4. On the other hand, the output signal COMP2 of the ENOR gate circuit G2 that compares the first bit of the layer address is supplied to the AND gate circuit G3 via the OR gate circuit G4. When the partial signal PER is active, an output of the OR gate circuit G4 is always maintained at a high level irrespective of the output of the ENOR gate circuit G2. That is, the layer address comparing circuit 47 that receives the partial signal PER invalidates the first bit and handles only next two bits for comparison.

To the layer address comparing circuit 47 of the core chip selected as the unused chip is supplied the unused chip signal DEF from the unused chip information holding circuit 33. The unused chip signal. DEF is the same as that supplied to the layer address generating circuit 46 within the same core chip. The AND gate circuit G3 of the layer address comparing circuit 47 receives the unused chip signal DEF along with the output signals COMP0 to COMP2. Thus, even if the chip selection information SEL matches with each bit of the layer address LID, a signal /DEF supplied to the AND gate circuit G3 via an inverter INV1 is maintained at a low level when the unused chip signal DEF is highly active. Therefore, the coincidence signal HIT is not output.

When all the eight core chips CC0 to CC7 are normally functioning, because all the layer addresses are used, the unused chip signal DEF and the partial signal PER are not supplied to any of the core chips CC0 to CC7. Thus, all layer address signal lines are activated and all the bits of the 3-bit layer address become the target of comparison.

When one of the eight core chips CC0 to CC7 is defective, the first bit of the layer address is cut off to make it a half address space and the package is used as the so-called partial product. In this case, the four core chips including the defective chip are selected as the unused chips and the unused chip signal DEF is supplied to the selected core chips. Because the remaining four chips are used as normal chips, the unused chip signal DEF is not supplied to them. In case of the partial product, the partial signal PER is supplied to all the core chips CC0 to CC7.

In the embodiment described above, it has been assumed that the number of defective chips is less than five. This is because the core chips are tested before assembly, and therefore a possibility of occurrence of defect in five or more chips after assembly is considerably low. However, the present invention is applicable even when the number of defective core chips is five or more. When five or six defective chips are to be handled, it is necessary to cut off the first two bits of the layer address. Therefore, one fourth address space (a portion equivalent to two core chips) can be secured by arranging two partial gate circuits. Furthermore, when seven core chips are defective, it is necessary to cut off all the three bits. Therefore, one eighth address space (a portion equivalent to one core chip) can be secured by arranging three partial gate circuits.

As described above, in the semiconductor device 10 according to the present embodiment, because the unused chip is skipped while allocating the layer address LID, the unused chip does not exist from the perspective of a controller. Thus, even if the defective chip is detected after assembly, only the normal core chips can be operated without having to make a request to the controller for a specific control.

Furthermore, in the present embodiment, if the defective chip is detected after assembly, the normal chips are also invalidated as per the requirement and because the number of valid core chips is considered as a power of two, the address space can be considered as a power of two. Therefore, the controller can easily control the layer addresses. Specifically, when the number of defective chips is one to four, the number of valid core chips can be four, when the number of defective chips is five to six, the number of valid core chips can be two, and when the number of defective chips is seven, the number of valid core chips can be one.

It is apparent that the present invention is not limited to the above embodiments, but may be modified and changed without departing from the scope and spirit of the invention.

For example, in the above embodiment, a DDR3 SDRAM is used as a plurality of core chips each of which has the same functions; however, the present invention is not limited thereto. Accordingly, the present invention can be also applied to DRAMs other than a DDR3 DRAM, and can be a semiconductor memory other than a DRAM, such as an SRAM (Static Random Access Memory), a PRAM (Phase Change Random Access Memory), an MRAM (Magnetic Random Access Memory), and a flash memory. In addition, these core chips can be a plurality of semiconductor chips with which functions other than that as a semiconductor memory are identical to each other or different from each other. That is, these core chips can be a semiconductor device such as a CPU (Central Processing Unit), an MCU (Micro Control Unit), a DSP (Digital Signal Processor), an ASIC (Application Specific Integrated Circuit), and an ASSP (Application Specific Standard Circuit). Furthermore, it is not necessary to stack all the core chips, and a part or all of the core chips can be arranged in a plane. Further, the number of core chips is not limited to eight.

In the embodiment described above, it has been exemplified that the chip identification number of the uppermost layer is (0, 0, 0) and it is incremented from the uppermost layer toward the lower layers. However, the present invention is not limited thereto, and the chip identification number of the lowermost layer can be (0, 0, 0) and it can be incremented from the lowermost layer toward the upper layers. Furthermore, the chip identification number can be decremented instead of incremented.

Figure 15A:
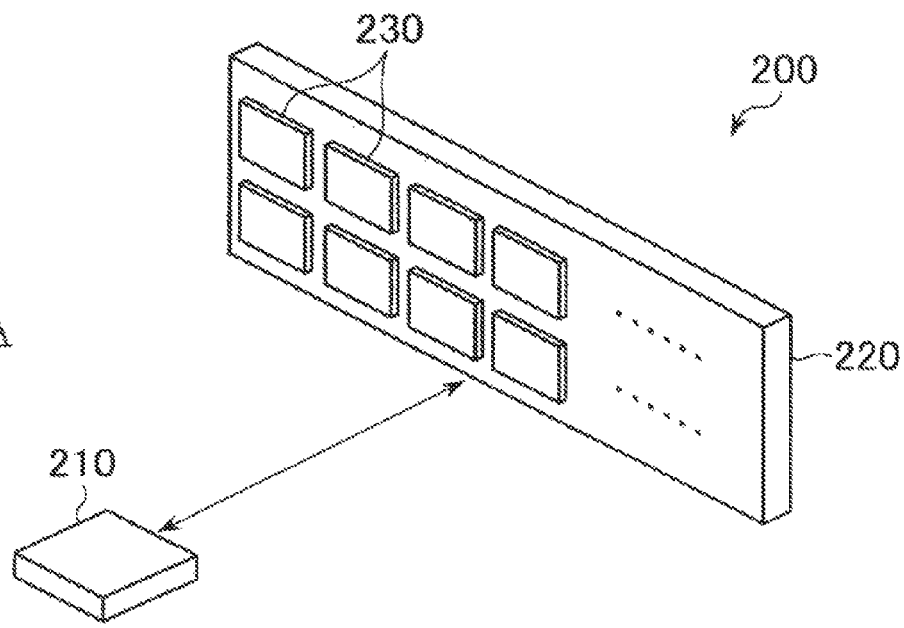
FIG. 15A is a diagram showing a configuration of a semiconductor system 200.
Figure 15B:
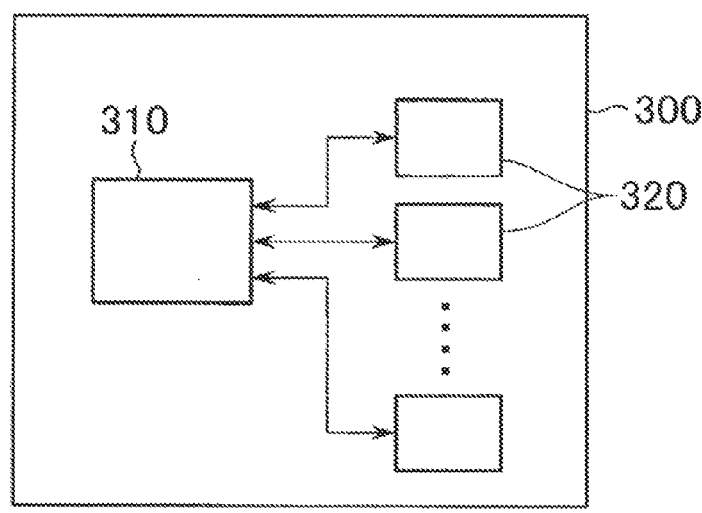
FIG. 15B is a diagram showing a configuration of a semiconductor system 300.

Further, the application of the present invention is not limited to a chip-stacked semiconductor device. Therefore, for example, as shown in FIG. 15A, in a semiconductor system 200 including a memory controller 210 and a memory module 220, an unused chip information holding circuit is provided in the memory controller 210. Thus, some of a plurality of memory chips 230 mounted on the memory module 220 can be selected as unused chips. Moreover, as shown in FIG. 15B, in a semiconductor system 300 having a CPU 31.0 and a plurality of cache memories 320 mounted on the same package, an unused chip information holding circuit is provided in the CPU 310. Thus, some of the cache memories 320 can be selected as unused.

What is claimed is:

1. A method for controlling power in a plurality of stacked semiconductor devices interconnected by through electrodes, comprising the steps of:
   receiving an unused chip signal in each of the plurality of stacked semiconductor devices through one or more through electrodes;
   enabling an internal voltage generating circuit in each of the plurality of stacked semiconductor devices if the corresponding unused chip signal has a first logic level; and
   disabling the internal voltage generating circuit in each of the plurality of stacked semiconductor devices if the corresponding unused chip signal has a second logic level not equal to the first logic level.

2. The method as claimed in claim 1 wherein each unused chip signal is received through a dedicated through electrode.

3. The method as claimed in claim 2 wherein the unused chip signals are received through shifted through electrodes.

4. The method as claimed in claim 1 wherein the unused chip signals are provided by an interface chip stacked together with the plurality of stacked semiconductor devices.

5. The method as claimed in claim 4 wherein the unused chip signals are provided by an unused chip information holding circuit on the interface chip.

6. The method as claimed in claim 5 wherein the unused chip information holding circuit comprises a plurality of fuses.

7. The method as claimed in claim 6 wherein unused chip information is written to the fuses during an operation test after assembly of the plurality of stacked semiconductor devices.

8. The method as claimed in claim 1 wherein the internal voltage generating circuit provides an internal voltage higher than an external power supply potential.

9. The method as claimed in claim 1 wherein the internal voltage generating circuit provides an internal voltage lower than an external power supply potential.

10. The method as claimed in claim 1 wherein the internal voltage generating circuit provides a plurality of internal voltages.

11. The method as claimed in claim 1 wherein the plurality of stacked semiconductor devices are memory devices.

12. The method as claimed in claim 1 wherein the plurality of stacked semiconductor devices are dynamic random access memory devices.

13. A system comprising:
   a plurality of stacked semiconductor devices interconnected by through electrodes, each of the stacked semiconductor devices being configured to:
   receive an unused chip signal through one or more of the through electrodes;
   enable an internal voltage generating circuit if the corresponding unused chip signal has a first logic level; and disable an internal voltage generating circuit if the corresponding unused chip signal has a second logic level that is not equal to the first logic level.

14. The system as claimed in claim 13 wherein each of the plurality of stacked semiconductor devices is configured to receive the unused chip signal through a dedicated through electrode.

15. The system as claimed in claim 14 wherein the plurality of stacked semiconductor devices are configured to receive the unused chip signals through shifted through electrodes.

16. The system as claimed in claim 13 wherein the system comprises an interface chip stacked together with the plurality of stacked semiconductor devices, the interface chip being configured to provide the unused chip signals.

17. The system as claimed in claim 16 wherein the interface chip comprises an unused chip information holding circuit, the unused chip information holding circuit being configured to provide the unused chip signals.

18. The system as claimed in claim 17 wherein the unused chip information holding circuit comprises a plurality of fuses.

19. The system as claimed in claim 18 wherein the interface chip is configured to write the unused chip information to the fuses during an operation test performed after assembly of the plurality of stacked semiconductor devices.

20. The system as claimed in claim 13 wherein the internal voltage generating circuit is configured to provide an internal voltage higher than an external power supply potential.

21. The system as claimed in claim 13 wherein the internal voltage generating circuit is configured to provide an internal voltage lower than an external power supply potential.

22. The system as claimed in claim 13 wherein the internal voltage generating circuit is configured to provide a plurality of internal voltages.

23. The system as claimed in claim 13 wherein the plurality of stacked semiconductor devices are memory devices.

24. The system as claimed in claim 13 wherein the plurality of stacked semiconductor devices are dynamic random access memory devices.

* * * * *